US012672458B2

(12) United States Patent
Zeng et al.

(10) Patent No.: US 12,672,458 B2
(45) Date of Patent: Jun. 30, 2026

(54) DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Cheng Zeng, Beijing (CN); Jaeho Lee, Beijing (CN); Hongwei Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 623 days.

(21) Appl. No.: 18/027,245

(22) PCT Filed: Jan. 27, 2022

(86) PCT No.: PCT/CN2022/074371
§ 371 (c)(1),
(2) Date: Mar. 20, 2023

(87) PCT Pub. No.: WO2023/141892
PCT Pub. Date: Aug. 3, 2023

(65) Prior Publication Data
US 2024/0292704 A1      Aug. 29, 2024

(51) Int. Cl.
*H10K 59/38* (2023.01)
*H10K 59/80* (2023.01)
*H10K 102/00* (2023.01)

(52) U.S. Cl.
CPC ........... *H10K 59/38* (2023.02); *H10K 59/878* (2023.02); *H10K 2102/331* (2023.02)

(58) Field of Classification Search
CPC ................. H10K 59/38; H10K 59/878; H10K 2102/331; H10K 59/00; H10K 50/854; H10K 50/858; G02F 1/1335; G02F 1/1336
See application file for complete search history.

(56) References Cited

U.S. PATENT DOCUMENTS 9,583,727 B2    2/2017    Cho et al.
9,722,001 B2    8/2017    Song et al.
(Continued)

FOREIGN PATENT DOCUMENTS

CN        101162276 A        4/2008
CN        101373234     *    2/2009
(Continued)

*Primary Examiner* — Mary Ellen Bowman
(74) *Attorney, Agent, or Firm* — Scully, Scott, Murphy & Presser, P.C.

(57)        ABSTRACT

Embodiments of the present disclosure provide a display panel and a display device. The display panel includes a first base substrate; a light emitting element layer, arranged on the first base substrate and configured to provide light of a first color; a color film layer, arranged at a side of the light emitting element layer away from the first base substrate; a color conversion layer, arranged between the light emitting element layer and the color film layer and configured to receive the light of the first color and convert at least part of the light of the first color into light of a second color; and a light extraction layer, arranged between the color conversion layer and the color film layer, and configured to converge at least one of the light of the first color and the light of the second color.

19 Claims, 17 Drawing Sheets

(56) References Cited

U.S. PATENT DOCUMENTS

| | | | |
|---|---|---|---|
| 9,806,275 | B2 | 10/2017 | Jung et al. |
| 9,978,973 | B2 | 5/2018 | Cho et al. |
| 10,056,436 | B2 | 8/2018 | Takii |
| 10,109,685 | B2 | 10/2018 | Song et al. |
| 10,236,463 | B2 | 3/2019 | Cho et al. |
| 10,403,688 | B2 | 9/2019 | Song et al. |
| 10,497,889 | B2 | 12/2019 | Cho et al. |
| 10,690,834 | B2 | 6/2020 | Wang et al. |
| 2014/0119049 | A1 | 5/2014 | Kim et al. |
| 2016/0327219 | A1 | 11/2016 | Hashiya et al. |
| 2018/0017726 | A1 | 1/2018 | Kim et al. |
| 2019/0148460 | A1 | 5/2019 | Kim et al. |
| 2019/0348472 | A1 | 11/2019 | Yun et al. |
| 2019/0386068 | A1 | 12/2019 | Song et al. |
| 2020/0056757 | A1 | 2/2020 | Zhang et al. |
| 2020/0099004 | A1 | 3/2020 | Cho et al. |
| 2020/0144333 | A1 | 5/2020 | Kim et al. |
| 2020/0219936 | A1* | 7/2020 | Han .................. G02F 1/133617 |
| 2020/0381484 | A1 | 12/2020 | Choe |
| 2021/0223623 | A1 | 7/2021 | Liu |
| 2022/0190039 | A1* | 6/2022 | Sun ...................... H10K 59/879 |
| 2022/0336780 | A1 | 10/2022 | Sun et al. |
| 2023/0117666 | A1 | 4/2023 | Ma |

FOREIGN PATENT DOCUMENTS

| | | | |
|---|---|---|---|
| CN | 101373234 | A | 2/2009 |
| CN | 105742318 | A | 7/2016 |
| CN | 205809493 | U | 12/2016 |
| CN | 107577084 | A | 1/2018 |
| CN | 108983499 | A | 12/2018 |
| CN | 109037271 | A | 12/2018 |
| CN | 109633965 | A | 4/2019 |
| CN | 104576691 | B | 10/2019 |
| CN | 111077732 | * | 4/2020 |
| CN | 111146248 | A | 5/2020 |
| CN | 111415973 | * | 7/2020 |
| CN | 111624817 | A | 9/2020 |
| CN | 111653683 | A | 9/2020 |
| CN | 112018152 | A | 12/2020 |
| CN | 214672621 | U | 11/2021 |
| EP | 2455784 | A1 | 5/2012 |
| JP | 2015128027 | A | 7/2015 |
| JP | 2016034017 | A | 3/2016 |
| JP | 2016189299 | A | 11/2016 |
| KR | 20120061538 | A | 6/2012 |
| KR | 20140056490 | A | 5/2014 |
| KR | 20160059164 | A | 5/2016 |

* cited by examiner

30

DISPLAY PANEL AND DISPLAY DEVICE

CROSS-REFERENCE TO RELATED APPLICATION

This Patent application is a U.S. National Phase of PCT International Patent Application No. PCT/CN2022/074371, filed on Jan. 27, 2022, the disclosure of which is incorporated herein by reference in its entirety.

TECHNICAL FIELD

Embodiments of the present disclosure relate to a display panel and a display device.

BACKGROUND

The quantum dot display device includes a quantum dot display panel and a blue backlight module, the quantum dot display panel includes a color filter layer and a quantum dot layer which are superposed; the color filter layer includes a red filter structure, a green filter structure and a blue filter structure; the quantum dot layer includes a red quantum dot structure and a green quantum dot structure; and the red quantum dot structure corresponds to the red filter structure and the green quantum dot structure corresponds to the green filter structure. The blue light emitted by the blue backlight module is injected into the quantum dot layer. Upon passing through the red quantum dot structure, the blue light excites the red quantum dot structure to emit red light. Upon passing through the green quantum dot structure, the blue light excites the green quantum dot structure to emit green light. The light that does not pass through the quantum dot structure is blue light, and the red light, the green light and the blue light are emitted from the quantum dot display panel after passing through the corresponding color filter structures.

The display structure combining the quantum dot layer and the organic light emitting diode (OLED) can achieve higher color gamut, higher resolution and wider viewing angle, which is suitable for large-size self-luminous display technology.

SUMMARY

At least one embodiment of the present disclosure provides a display panel, for the display panel, a light extraction layer is provided between the color conversion layer and the color film layer to gather the light incident into the light extraction layer, so as to improve the efficiency of light output from the front of the display panel.

At least one embodiment of the present disclosure provides a display panel, the display panel includes: a first base substrate; a light emitting element layer, arranged on the first base substrate and configured to provide light of a first color; a color film layer, arranged at a side of the light emitting element layer away from the first base substrate; a color conversion layer, arranged between the light emitting element layer and the color film layer and configured to receive the light of the first color and convert at least part of the light of the first color into light of a second color; and a light extraction layer, arranged between the color conversion layer and the color film layer and configured to converge at least one of the light of the first color and the light of the second color.

For example, in the display panel provided by at least one embodiment of the present disclosure, the color conversion layer comprises a plurality of color conversion patterns, and the display panel further comprises a light transmitting pattern; the plurality of color conversation patterns comprise a first color conversion pattern and a second color conversion pattern, the first color conversion pattern comprises first color conversion particles and the second color conversion pattern comprises second color conversion particles, the light transmitting pattern comprises scattering particles, the first color conversion particles are configured to convert light of the first color into light of the second color, and the second color conversion particles are configured to convert light of the first color into light of a third color; the light transmitting pattern is configured to allow the light of the first color to pass through.

For example, in the display panel provided by at least one embodiment of the present disclosure, the color film layer comprises a first color film pattern, a second color film pattern and a third color film pattern, and an orthographic projection of the first color film pattern on the first base substrate and an orthographic projection of the first color conversion pattern on the first base substrate are at least partially overlapped with each other, an orthographic projection of the second color film pattern on the first base substrate and an orthographic projection of the second color conversion pattern on the first base substrate are at least partially overlapped with each other, and an orthographic projection of the third color film pattern on the first base substrate and an orthographic projection of the light transmitting pattern on the first base substrate are at least partially overlapped with each other.

For example, in the display panel provided by at least one embodiment of the present disclosure, the light extraction layer comprises a single-layer structure or a stacked multi-layer structure.

For example, in the display panel provided by at least one embodiment of the present disclosure, the light extraction layer comprises a single-layer structure and comprises a plurality of light extraction patterns, the plurality of light extraction patterns are arranged along a first direction and each extends along a second direction, the first direction and the second direction are intersected with each other, and a direction perpendicular to a plane where the first direction and the second direction are located is a third direction, along the third direction, a size of a position of each of the plurality of light extraction patterns close to the first base substrate in the first direction is larger than a size of a position of the each of the plurality of light extraction patterns away from the first base substrate in the first direction.

For example, in the display panel provided by at least one embodiment of the present disclosure, the light extraction layer further comprises a substrate which is continuously arranged, and the plurality of light extraction patterns are arranged at a side of the substrate away from the first base substrate, and each of the plurality of light extraction patterns comprises convex structures which are continuous along the first direction, the convex structures are arranged along the first direction, and each of the convex structures extends along the second direction.

For example, in the display panel provided by at least one embodiment of the present disclosure, on a plane where the first direction and the third direction are located, a cross-sectional shape of the plurality of the light extraction patterns comprises at least one of sawtooth and wave.

For example, in the display panel provided by at least one embodiment of the present disclosure, the light extraction layer comprises a substrate which is continuously arranged, the plurality of light extraction patterns are arranged at a side of the substrate away from the first base substrate, and each of the plurality of light extraction patterns comprises convex structures which are spaced apart with each other, at least two of the convex structures are provided with a first spacing region therebetween, the convex structures are arranged along the first direction, and each of the convex structures extends along the second direction.

For example, in the display panel provided by at least one embodiment of the present disclosure, wherein in the first direction, adjacent ones of the first color conversion pattern, the second color conversion pattern and the light transmitting pattern are spaced apart by a first black matrix, and in the first direction, the first black matrix and the first spacing region are in one-to-one correspondence.

For example, in the display panel provided by at least one embodiment of the present disclosure, on a plane where the first direction and the third direction are located, a cross-sectional shape of each of the light extraction patterns comprises a sawtooth, and a triangle comprised in the sawtooth is at least one of a right-angled isosceles triangle and an equilateral triangle, and in the first direction, lengths of base edges of the right-angled isosceles triangle and the equilateral triangle close to the first base substrate and a size of a corresponding one of the first color conversion pattern, the second color conversion pattern or the light transmitting pattern in a direction parallel to the base edge are equal or substantially equal.

For example, in the display panel provided by at least one embodiment of the present disclosure, a ratio of a number of the convex structures to a sum of a number of the first color conversion pattern, a number of the second color conversion pattern and a number of the light transmitting pattern is 1:1 or 2:1.

For example, in the display panel provided by at least one embodiment of the present disclosure, an orthographic projection of the first color conversion pattern on the first base substrate, an orthographic projection of the second color conversion pattern on the first base substrate, and an orthographic projection of the light transmitting pattern on the first base substrate are respectively located within the orthographic projections of the convex structures corresponding to the first color conversion pattern, the second color conversion pattern and the light transmitting pattern on the first base substrate.

For example, in the display panel provided by at least one embodiment of the present disclosure, the plurality of the light extraction patterns and the substrate are integrated.

For example, in the display panel provided by at least one embodiment of the present disclosure, the light extraction layer comprises a multi-layer structure, and the light extraction layer comprises a first light extraction layer and a second light extraction layer which are stacked; the first light extraction layer comprises a plurality of first light extraction patterns, the plurality of first light extraction patterns are arranged along a first direction and each extends along a second direction, the first direction and the second direction are intersected with each other, and a direction perpendicular to a plane where the first direction and the second direction are located is a third direction, and along the third direction, a size of a position of each of the plurality of first light extraction patterns close to the first base substrate in the first direction is larger than a size of a position of the each of the plurality of first light extraction patterns away from the first base substrate in the first direction; the second light extraction layer comprises a plurality of second light extraction patterns, the plurality of second light extraction pattern are arranged along a fourth direction and each extends along a fifth direction, the fourth direction and the fifth direction are intersected with each other, a direction perpendicular to a plane where the fourth direction and the fifth direction are located is the third direction, and along the third direction, a size of a position of each of the plurality of second light extraction patterns close to the first base substrate in the fourth direction is larger than a size of a position of the each of the plurality of second light extraction patterns away from the first base substrate in the fourth direction.

For example, in the display panel provided by at least one embodiment of the present disclosure, the first light extraction layer further comprises a first substrate which is continuously arranged, and the plurality of first light extraction patterns are arranged at a side of the first substrate away from the first base substrate, each of the plurality of first light extraction patterns comprises a plurality of first sawtooth portions which are continuous along the first direction, the plurality of first sawtooth portions are arranged along the first direction, and each of the plurality of first sawtooth portions extends along the second direction; the second light extraction layer further comprises a second substrate which is continuously arranged, and the plurality of second light extraction patterns are arranged at a side of the second substrate away from the first base substrate, each of the plurality of second light extraction patterns comprises a plurality of second sawtooth portions which are continuous along the fourth direction, the plurality of second sawtooth portions are arranged along the fourth direction, and each of the plurality of second sawtooth portions extends along the fifth direction; an included angle between the second direction and the fifth direction ranges from 45° to 90°.

For example, in the display panel provided by at least one embodiment of the present disclosure, the first light extraction layer further comprises a first substrate which is continuously arranged, and the plurality of first light extraction patterns are arranged at a side of the first substrate away from the first base substrate, each of the plurality of first light extraction patterns comprises a plurality of first sawtooth portions which are continuous along the first direction, the plurality of first sawtooth portions are arranged along the first direction, and each of the plurality of first sawtooth portions extends along the second direction; the second light extraction layer further comprises a second substrate which is continuously arranged, and the plurality of second light extraction patterns are arranged at a side of the second substrate away from the first base substrate, each of the plurality of second light extraction patterns comprises a plurality of second sawtooth portions which are spaced apart along the fourth direction, and adjacent ones of the plurality of second sawtooth portions are provided with a second spacing region therebetween, and the plurality of second sawtooth portions are arranged along the fourth direction, and each of the plurality of second sawtooth portions extends along the fifth direction; an included angle between the second direction and the fifth direction ranges from 45° to 90°.

For example, in the display panel provided by at least one embodiment of the present disclosure, the second light extraction layer is on a side of the first light extraction layer close to the first base substrate, and in the fourth direction, adjacent ones of the first color conversion pattern, the second color conversion pattern and the light transmitting pattern are spaced apart by a first black matrix, and in the fourth direction, the first black matrix and the second spacing region are in one-to-one correspondence.

For example, in the display panel provided by at least one embodiment of the present disclosure, in the third direction, a maximum thickness of the first black matrix is greater than a maximum thickness of at least one of the first color conversion pattern and the second color conversion pattern.

For example, in the display panel provided by at least one embodiment of the present disclosure, on a plane where the fourth direction and the third direction are located, a cross-sectional shape of each of the plurality of second sawtooth portion comprises at least one of a right-angled isosceles triangle and an equilateral triangle, and in the fourth direction, lengths of base edges of the right-angled isosceles triangle and the equilateral triangle close to the first base substrate and a size of a corresponding one of the first color conversion pattern, the second color conversion pattern or the light transmitting pattern in a direction parallel to the base edge are equal or substantially equal.

For example, in the display panel provided by at least one embodiment of the present disclosure, an orthographic projection of the first color conversion pattern on the first base substrate and an orthographic projection of the second color conversion pattern on the first base substrate are respectively located within orthographic projections of the second sawtooth portions corresponding to the first color conversion pattern and the second color conversion pattern on the first base substrate.

For example, in the display panel provided by at least one embodiment of the present disclosure, a ratio of a number of the plurality of second sawtooth portions to a sum of a number of the first color conversion pattern and a number of the second color conversion pattern is 1:1 or 2:1.

For example, in the display panel provided by at least one embodiment of the present disclosure, the first light extraction layer further comprises a first substrate which is continuously arranged, the plurality of first light extraction patterns are arranged at a side of the first substrate away from the first base substrate, and each of the plurality of first light extraction patterns comprises a plurality of first sawtooth portions which are spaced apart along the first direction, and adjacent ones of the plurality of first sawtooth portions are provided with a first spacing region therebetween, and the plurality of first sawtooth portions are arranged along the first direction, each of the plurality of first sawtooth portions extends along the second direction; the second light extraction layer further comprises a second substrate which is continuously arranged, and the plurality of second light extraction patterns are arranged at a side of the second substrate away from the first base substrate, each of the plurality of second light extraction patterns comprises a plurality of second sawtooth portions which are spaced apart along the fourth direction, and adjacent ones of the plurality of second sawtooth portions are provided with a second spacing region therebetween, and the plurality of second sawtooth portions are arranged along the fourth direction, and each of the plurality of second sawtooth portions extends along the fifth direction; an included angle between the second direction and the fifth direction ranges from 45° to 90°.

For example, in the display panel provided by at least one embodiment of the present disclosure, the included angle between the second direction and the fifth direction is 90°, in the first direction and the fourth direction, adjacent ones of the first color conversion pattern, the second color conversion pattern and the light transmitting pattern are spaced apart by a first black matrix, and in the first direction, the first black matrix and the first spacing region are in one-to-one correspondence, in the fourth direction, the first black matrix and the second spacing region are in one-to-one corresponding.

For example, in the display panel provided by at least one embodiment of the present disclosure, on a plane where the first direction and the third direction are located, a cross-sectional shape of each of the plurality of first sawtooth portions comprises at least one of a right-angled isosceles triangle and an equilateral triangle, and, in the first direction, lengths of base edges of the right-angled isosceles triangle and the equilateral triangle close to the first base substrate and a size of a corresponding one of the first color conversion pattern, the second color conversion pattern or the light transmitting pattern in a direction parallel to the base edge are equal or substantially equal; on a plane where the fourth direction and the third direction are located, a cross-sectional shape of each of the plurality of second sawtooth portions comprises at least one of a right-angled isosceles triangle and an equilateral triangle, and, in the fourth direction, lengths of base edges of the right-angled isosceles triangle and the equilateral triangle close to the first base substrate and a size of a corresponding one of the first color conversion pattern, the second color conversion pattern or the light transmitting pattern in a direction parallel to the base edge are equal or substantially equal.

For example, in the display panel provided by at least one embodiment of the present disclosure, an orthographic projection of the first color conversion pattern on the first base substrate and an orthographic projection of the second color conversion pattern on the first base substrate are respectively located within orthographic projections of first sawtooth portions corresponding to the first color conversion pattern and the second color conversion pattern on the first base substrate; an orthographic projection of the first color conversion pattern on the first base substrate and an orthographic projection of the second color conversion pattern on the first base substrate are respectively located within orthographic projections of the second sawtooth portions corresponding to the first color conversion pattern and the second color conversion pattern on the first base substrate.

For example, in the display panel provided by at least one embodiment of the present disclosure, a ratio of a number of the plurality of first sawtooth portions to a sum of a number of the first color conversion pattern and a number of the second color conversion pattern is 1:1 or 2:1; a ratio of a number of the plurality of second sawtooth portions to a sum of the number of the first color conversion pattern and the number of the second color conversion pattern is 1:1 or 2:1.

For example, in the display panel provided by at least one embodiment of the present disclosure, the first light extraction layer is arranged at a side of the second light extraction layer away from the first base substrate, or the first light extraction layer is arranged at a side of the second light extraction layer close to the first base substrate.

For example, in the display panel provided by at least one embodiment of the present disclosure, a connection portion is arranged between the first light extraction layer and the second light extraction layer, and the connection portion fills the spacing region between the first light extraction layer and the second light extraction layer, and the first light extraction layer is arranged at a side of the second light extraction layer close to the first base substrate in the first direction, on a plane where the first direction and the third direction are located, a cross-sectional shape of the connection portion is complementary with a cross-sectional shape of the plurality of first light extraction patterns, or, the second light extraction layer is arranged at a side of the first light extraction layer close to the first base substrate, on a plane where the fourth direction and the third direction are located, the cross-sectional shape of the connection portion is complementary with the cross-sectional shape of the plurality of first light extraction patterns.

For example, in the display panel provided by at least one embodiment of the present disclosure, the light extraction layer comprises a plurality of convex portions arranged in a single layer, and the plurality of convex portions are arranged in an array along a first direction and a second direction which cross each other.

For example, in the display panel provided by at least one embodiment of the present disclosure, a direction perpendicular to a main surface of the first base substrate is a third direction, and along the third direction, from a position close to the first base substrate to a position away from the first base substrate, area of cross-sections of the plurality of convex portions in planes parallel to the main surface of the first base substrate gradually decrease.

For example, in the display panel provided by at least one embodiment of the present disclosure, a shape of each of the plurality of convex portions comprises at least one of a triangular pyramid, a cone and a hemisphere.

For example, in the display panel provided by at least one embodiment of the present disclosure, the shape of each of the plurality of convex portions comprises the triangular pyramid, a bottom surface of the triangular pyramid is an equilateral triangle, a ratio of a distance between a gravity center of the bottom surface of the triangular pyramid to a vertex of the bottom surface to a height of the triangular pyramid ranges from 0.5 to 1.0, and the distance between the gravity center of the bottom surface of the triangular pyramid and the vertex of the bottom surface ranges from 20 microns to 30 microns; and/or the shape of each of the plurality of convex portions comprises the cone, a ratio of a radius of a bottom surface of the cone to a height of the cone ranges from 0.5 to 1.0, and the radius of the bottom surface of the cone ranges from 10 microns to 25 microns; and/or the shape of each of the plurality of convex portions comprises the hemisphere, a ratio of a radius of a bottom surface of the hemisphere to a height of the hemisphere ranges from 0.8 to 1.0, and the radius of the bottom surface of the hemisphere ranges from 10 microns to 25 microns.

For example, in the display panel provided by at least one embodiment of the present disclosure, a convex portion at a side of the first color conversion pattern away from the first base substrate is a first convex portion, a convex portion at a side of the second color conversion pattern away from the first base substrate is a second convex portion, and a convex portion at a side of the light transmitting pattern away from the first base substrate is a third convex portion; a height of the first convex portion is greater than a height of the third convex portion, and a height of the third convex portion is greater than a height of the second convex portion.

For example, in the display panel provided by at least one embodiment of the present disclosure, shapes of the plurality of convex portions are all triangular pyramids, and bottom surfaces of the triangular pyramids are equilateral triangles; a ratio of a distance between a gravity center of a bottom surface of a first triangular pyramid corresponding to the first convex portion and a vertex of the bottom surface to a height of the first triangular pyramid ranges from 0.8 to 1.0, and the distance between the gravity center of the bottom surface of the first triangular pyramid and the vertex of the bottom surface ranges from 25 microns to 30 microns; a ratio of a distance between a gravity center of a bottom surface of a second triangular pyramid corresponding to the second convex portion and a vertex of the bottom surface to a height of the second triangular pyramid ranges from 0.5 to 0.8, and the distance between the gravity center of the bottom surface of the second triangular pyramid and the vertex of the bottom surface ranges from 20 microns to 25 microns; a ratio of a distance from a gravity center of a bottom surface of a third triangular pyramid corresponding to the third convex portion and a vertex of the bottom surface to a height of the third triangular pyramid ranges from 0.5 to 0.8, and the distance from the gravity center of the bottom surface of the third triangular pyramid and the vertex of the bottom surface ranges from 20 microns to 25 microns.

For example, in the display panel provided by at least one embodiment of the present disclosure, shapes of the plurality of convex portions are all cones; a ratio of a radius of a bottom surface of a first cone corresponding to the first convex portion to a height of the first cone ranges from 0.5 to 1.0, and the radius of the bottom surface of the first cone ranges from 20 microns to 25 microns; a ratio of a radius of a bottom surface of a second cone corresponding to the second convex portion to a height of the second cone ranges from 0.5 to 1.0, and the radius of the bottom surface of the second cone ranges from 10 microns to 15 microns; a ratio of a radius of a bottom surface of a third cone corresponding to the third convex portion to a height of the third cone ranges from 0.5 to 1.0, and the radius of the bottom surface of the third cone ranges from 15 microns to 20 microns.

For example, in the display panel provided by at least one embodiment of the present disclosure, shapes of the plurality of convex portions are all hemispheres; a ratio of a radius of a bottom surface of a first hemisphere corresponding to the first convex portion to a height of the first hemisphere ranges from 0.8 to 1.0, and the radius of the bottom surface of the first hemisphere ranges from 20 microns to 25 microns; a ratio of a radius of a bottom surface of a second hemisphere corresponding to the second convex portion to a height of the second hemisphere ranges from 0.8 to 1.0, and the radius of the bottom surface of the second hemisphere ranges from 10 microns to 15 microns; a ratio of a radius of a bottom surface of a third hemisphere corresponding to the third convex portion to a height of the third hemisphere ranges from 0.8 to 1.0, and the radius of the bottom surface of the third hemisphere ranges from 15 microns to 20 microns.

For example, in the display panel provided by at least one embodiment of the present disclosure, shapes of the first convex portion, the second convex portion and the third convex portion are all different.

For example, in the display panel provided by at least one embodiment of the present disclosure, a third spacing region is arranged between at least two adjacent ones of the plurality of convex portions; adjacent ones of the first color conversion pattern, the second color conversion pattern and the light transmitting pattern are spaced apart by a first black matrix, and the first black matrix and the third spacing region are in one-to-one correspondence.

For example, in the display panel provided by at least one embodiment of the present disclosure, a direction perpendicular to a main surface of the first base substrate is a third direction, and a shape of a cross-section of each of the plurality of convex portions on a plane formed by the first direction and the third direction comprises at least one of a triangle and an arch, and a length of a base edge of the triangle or the arch close to the first base substrate and a size of a corresponding one of the color conversion pattern or the light transmitting pattern in a direction parallel to the base edge are equal to or substantially equal.

For example, in the display panel provided by at least one embodiment of the present disclosure, a ratio of a number of the plurality of convex portions to a sum of a number of the first color conversion pattern, a number of the second color conversion pattern and a number of the light transmitting pattern is 1:1 or 2:1.

For example, in the display panel provided by at least one embodiment of the present disclosure, the color conversion layer comprises a flat portion, a first color conversion pattern and a second color conversion pattern, the first color conversion pattern comprises first color conversion particles, the second color conversion pattern comprises second color conversion particles, the first color conversion particles are configured to convert light of the first color into light of the second color, the second color conversion particles are configured to convert light of the first color into light of a third color, and the flat portion is configured to make that the light of the first color entering the flat portion directly transmitted by the first color.

For example, in the display panel provided by at least one embodiment of the present disclosure, the light extraction layer comprises a plurality of convex portions, and the plurality of convex portions are arranged in an array along a first direction and a second direction which cross each other, and a shape of each of the plurality of convex portions is a triangular pyramid, a cone or a hemisphere, and a ratio of a number of the plurality of convex portions to a sum of a number of the first color conversion pattern and a number of the second color conversion pattern is 1:1 or 2:1.

For example, in the display panel provided by at least one embodiment of the present disclosure, a convex portion at a side of the first color conversion pattern away from the first base substrate is a first convex portion, and a convex portion at a side of the second color conversion pattern away from the first base substrate is a second convex portion; a direction perpendicular to a main surface of the first base substrate is a third direction, and along the third direction, a thickness of the first convex portion is greater than a thickness of the second convex portion.

For example, in the display panel provided by at least one embodiment of the present disclosure, shapes of the plurality of convex portions are all triangular pyramids, and bottom surfaces of the triangular pyramids are equilateral triangles; a ratio of a distance between a gravity center of a bottom surface of a first triangular pyramid corresponding to the first convex portion and a vertex of the bottom surface to a height of the first triangular pyramid ranges from 0.8 to 1.0, and the distance between the gravity center of the bottom surface of the first triangular pyramid and the vertex of the bottom surface ranges from 25 microns to 30 microns; a ratio of a distance between a gravity center of a bottom surface of a second triangular pyramid corresponding to the second convex portion and a vertex of the bottom surface to a height of the second triangular pyramid ranges from 0.5 to 0.8, and the distance between the gravity center of the bottom surface of the second triangular pyramid and the vertex of the bottom surface ranges from 20 microns to 25 microns.

For example, in the display panel provided by at least one embodiment of the present disclosure, shapes of the plurality of convex portions are all cones; a ratio of a radius of a bottom surface of a first cone corresponding to the first convex portion to a height of the first cone ranges from 0.5 to 1.0, and the radius of the bottom surface of the first cone ranges from 20 microns to 25 microns; a ratio of a radius of a bottom surface of a second cone corresponding to the second convex portion to a height of the second cone ranges from 0.5 to 1.0, and the radius of the bottom surface of the second cone ranges from 10 microns to 15 microns.

For example, in the display panel provided by at least one embodiment of the present disclosure, shapes of the plurality of convex portions all hemispheres; a ratio of a radius of a bottom surface of a first hemisphere corresponding to the first convex portion to a height of the first hemisphere ranges from 0.8 to 1.0, and the radius of the bottom surface of the first hemisphere ranges from 20 microns to 25 microns; a ratio of a radius of a bottom surface of a second hemisphere corresponding to the second convex portion to a height of the second hemisphere ranges from 0.8 to 1.0, and the radius of the bottom surface of the second hemisphere ranges from 10 microns to 15 microns.

For example, in the display panel provided by at least one embodiment of the present disclosure, a shape of the first convex portion is one of the cone, the hemisphere and the triangular pyramid, and a shape of the second convex portion is another one of the cone, the hemisphere and the triangular pyramid.

For example, in the display panel provided by at least one embodiment of the present disclosure, a bottom surface of the triangular pyramid is an equilateral triangle, a ratio of a distance between a gravity center of the equilateral triangle and a vertex of the bottom surface to a height of the triangular pyramid ranges from 0.5 to 1.0, and the distance between the gravity center of the bottom surface of the triangular pyramid and the vertex of the bottom surface ranges from 20 microns to 30 microns; a ratio of a radius of a bottom surface of the cone to a height of the cone ranges from 0.5 to 1.0, and the radius of the bottom surface of the cone ranges from 10 microns to 25 microns; a ratio of a radius of a bottom surface of the hemisphere to a height of the hemisphere ranges from 0.8 to 1.0, and the radius of the bottom surface of the hemisphere ranges from 10 microns to 25 microns.

For example, in the display panel provided by at least one embodiment of the present disclosure, a material of the light extraction layer comprises at least one of acrylic resin, polyurethane resin, silicone resin and epoxy resin, and a refractive index of the light extraction layer ranges from 1.4 to 1.65.

For example, in the display panel provided by at least one embodiment of the present disclosure, regions corresponding to the first color conversion pattern, the second color conversion pattern and the light transmitting pattern are light transmitting regions, and regions corresponding to light emitting elements in the light emitting element layer are light emitting regions, and area of the light transmitting regions are larger than area of the light emitting regions.

For example, in the display panel provided by at least one embodiment of the present disclosure, a ratio of the area of the light transmitting regions to the area of the light emitting regions ranges from 100% to 120%.

For example, in the display panel provided by at least one embodiment of the present disclosure, on a plane perpendicular to a main surface of the first base substrate, a shape of a pixel of the light emitting element layer, a shape of the first color conversion pattern, a shape of the second color conversion pattern and a shape of the light transmitting pattern are the same, and an orthographic projection of the pixel of the light emitting element layer on the first base substrate is located within an orthographic projection of the first color conversion pattern, an orthographic projection of the second color conversion pattern and an orthographic projection of the light transmitting pattern on the first base substrate.

For example, in the display panel provided by at least one embodiment of the present disclosure, the color film layer further comprises a second black matrix, and a thickness of the second black matrix in a direction perpendicular to a main surface of the first base substrate is smaller than a thickness of the first color film pattern, a thickness of the second color film pattern and a thickness of the third color film pattern in the direction perpendicular to the main surface of the first base substrate.

For example, in the display panel provided by at least one embodiment of the present disclosure, adjacent ones of the first color conversion pattern, the second color conversion pattern and the light transmitting pattern are separated by a first black matrix, and a thickness of the first black matrix in the direction perpendicular to the main surface of the first base substrate is greater than the thickness of the second black matrix in the direction perpendicular to the main surface of the first base substrate.

At least one embodiment of the present disclosure further provides a display device, and the display device includes any one of the display panels mentioned above.

BRIEF DESCRIPTION OF DRAWINGS

In order to more clearly explain the technical scheme of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

In order to make objects, technical details and advantages of embodiments of the present disclosure clear, the technical solutions of the embodiments will be described in a clearly and fully understandable way in connection with the related drawings of the embodiments of the present disclosure. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical terms and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising." "includes," "including." etc., are intended to specify that the elements or the objects stated before these terms encompass the elements or the objects listed after these terms as well as equivalents thereof, but do not exclude other elements or objects. Similar words such as "connected" or "connected" are not limited to physical or mechanical connection, but can include electrical connection, whether direct or indirect. "Up", "down", "left" and "right" are only used to indicate the relative positional relationship. When the absolute position of the described object changes, the relative positional relationship may also change accordingly.

Organic light emitting diode display panel has the characteristics of self-luminescence, wide viewing angle, wide color gamut, high contrast, thinness, foldability, flexibility and portability, and it has become the main development direction in the display field. Quantum-dot technology (QD) uses nano-scale semiconductor particles to emit light with a specific frequency by applying a certain electric field or light pressure to them. The light emitting frequency of the quantum dots is related to the particle size of the semiconductor particles. Therefore, the frequency of the emitted light can be adjusted by adjusting the particle size of the semiconductor particles, that is, the color of the emitted light can be adjusted. The spectrum emitted by the quantum dots is narrower than a half-peak width of the self-luminous spectrum of organic light emitting diodes, and the emitted light is purer in color and higher in color saturation. The display structure combining a quantum dot layer and an organic light emitting diode can realize higher color gamut, higher resolution and wider viewing angle, so it is more suitable for large-size self-luminous display panels.

Figure 1:
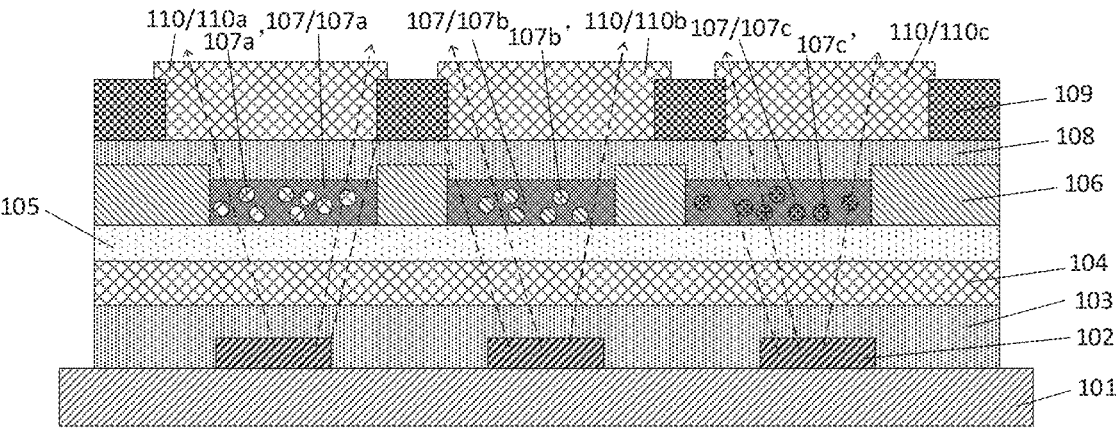
FIG. 1 is a schematic cross-sectional view of a display device combining a quantum dot layer and an organic light emitting diode.

For example, FIG. 1 is a schematic cross-sectional structure of a display device combining a quantum dot layer and an organic light emitting diode. As illustrated by FIG. 1, a light emitting element layer 102 is arranged on a base substrate 101, and a first inorganic encapsulation layer 103, an organic encapsulation layer 104 and a second inorganic encapsulation layer 105 are arranged at a side of the light emitting element layer 102 away from the base substrate 101. A quantum dot layer 107, which includes a red quantum dot layer 107*a*, a green quantum dot layer 107*b* and a light transmitting layer 107*c*, is arranged at a side of the second inorganic encapsulation layer 105 away from the base substrate 101; the red quantum dot layer 107*a* includes red quantum dots 107*a'*, the green quantum dot layer 107*b* includes green quantum dots 107*b'*, and the light transmitting layer 107*c* includes scattering particles 107*c'*. The red quantum dot layer 107*a*, the green quantum dot layer 107*b* and the light transmitting layer 107*c* are separated by a first black matrix 106, and a planarization layer 108 is arranged at a side of the quantum dot layer 107 away from the base substrate 101, and a color film layer 110 is arranged at a side of the planarization layer 108 away from the base substrate 101. The color film layer 110 includes a red film layer 110*a*, a green film layer 110*b* and a blue film layer 110. The red color film 110*a*, the green color film 110*b* and the blue color film 110*c* are separated by a second black matrix 109, and an orthographic projection of the red color film 110*a* on the base substrate 101 and an orthographic projection of the red quantum dot layer 107*a* on the base substrate 101 are at least partially overlapped with each other, and an orthographic projection of the green color film 110*a* on the base substrate 101 and an orthographic projection of the green quantum dot layer 107*b* on the base substrate 101 are at least partially overlapped with each other, and an orthographic projection of the blue color film layer 110*c* on the base substrate 101 and an orthographic projection of the light transmitting layer 107*c* on the base substrate 101 are at least partially overlapped with each other. In the case that the light emitting element layer 102 includes a blue light emitting diode, the blue light emitted from the light emitting element layer 102 passes through the red quantum dot layer 107*a* to convert the blue light into red light, the blue light emitted from the light emitting element layer 102 passes through the green quantum dot layer 107*b* to convert the blue light into green light, and the blue light emitted from the light emitting element layer 102 still exits as blue light after passing through the light transmitting layer 107c. As illustrated by FIG. 1, because the quantum dots have the characteristic of homogeneous phase of the emitted light after being excited, the light beyond a certain viewing angle cannot be emitted to a surface of the display device, resulting in the loss of light emitting efficiency at a front side of the display device. For example, a part of the red light emitted from the red quantum dot layer 107a exceeds a certain viewing angle and finally reaches the second black matrix 109 to be absorbed by the second black matrix 109; a part of the green light emitted from the green quantum dot layer 107b exceeds a certain viewing angle, and finally reaches the second black matrix 109 to be absorbed by the second black matrix 109, so that the red light and the green light exceeding a certain viewing angle cannot be emitted to the surface of the display device, which leads to the loss of light emitting efficiency of the front side of the display device, and the phenomenon of uneven light mixing will occur.

The inventor(s) of the present disclosure has noticed that, a light extraction layer can be arranged between the light emitting element layer and the color film layer, and the light extraction layer can change the emitting direction of light, that is, the emitting direction of light with a large viewing angle can be changed, so that the light with a large viewing angle can be emitted from the front side of the display device as much as possible, so as to converge at least one of blue light, red light and green light, thereby improving the light emitting efficiency at the front side of the display device.

At least one embodiment of the present disclosure provides a display panel, which includes a first base substrate, a light emitting element layer arranged on the first base substrate, a color film layer arranged at a side of the light emitting element layer away from the first base substrate, a color conversion layer arranged between the light emitting element layer and the color film layer, and a light extraction layer arranged between the color conversion layer and the color film layer. The light emitting element layer is configured to provide light of a first color, the color conversion layer is configured to receive the light of the first color and convert at least part of the light of the first color into light of a second color, and the light extraction layer is configured to converge at least one of the light of the first color and the light of the second color.

Figure 2:
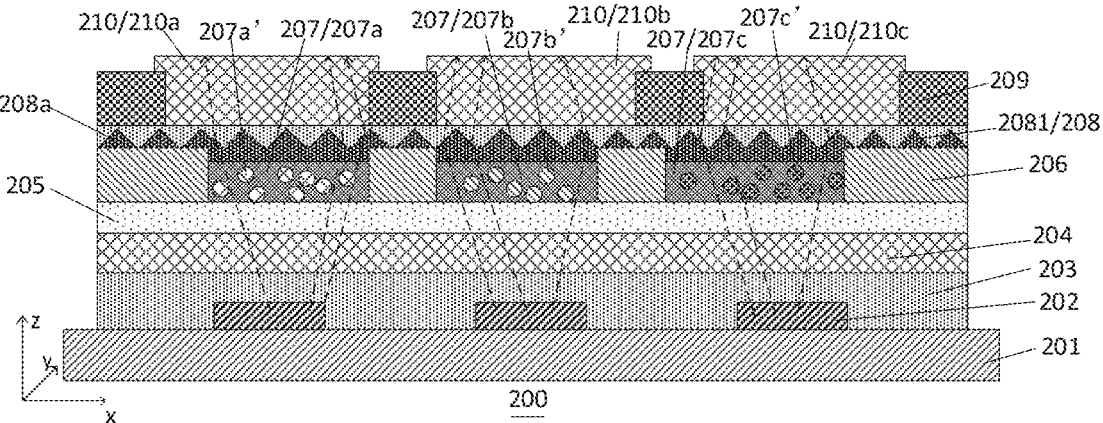
FIG. 2 is a schematic cross-sectional view of a display panel provided by at least one embodiment of the present disclosure.

For example, FIG. 2 is a schematic cross-sectional structure of a display panel provided by at least one embodiment of the present disclosure. As illustrated by FIG. 2, the display panel 200 includes a first base substrate 201, a light emitting element layer 202 arranged on the first base substrate 201, a color film layer 210 arranged at a side of the light emitting element layer 202 away from the first base substrate, a color conversion layer 207 arranged between the light emitting element layer 202 and the color film layer 210, and a light extraction layer 208 arranged between the color conversion layer 207 and the color film layer 210. The light emitting element layer 202 is configured to provide light of a first color, the color conversion layer 207 is configured to receive the light of the first color and convert at least part of the light of the first color into light of a second color, and the light extraction layer 208 is configured to converge at least one of the light of the first color and the light of the second color.

For example, as illustrated by FIG. 2, the main function of the color film layer 210 on the color conversion layer 207 is to further filter some light of the first color that is not converted by the color conversion pattern in the color conversion layer 207, thereby ensuring the color gamut of the display panel 200.

For example, by arranging the light extraction layer 208 between the color conversion layer 207, the light transmitting pattern 207 and the color film layer 210, the display panel 200 converge the light incident on the light extraction layer 208, so as to improve the light emitting efficiency of a front side of the display panel 200.

For example, as illustrated by FIG. 2, the color conversion layer 207 includes a plurality of color conversion patterns 207a/207b, and the display panel further includes a light transmitting pattern 207c, the plurality of color conversion patterns 207a/207b are arranged on the same layer with the light transmitting pattern 207c and include a first color conversion pattern 207a and a second color conversion pattern 207b. The first color conversion pattern 207a includes first color conversion particles 207a', the second color conversion pattern 207b includes second color conversion particles 207b', the light transmitting pattern 207c includes scattering particles 207c', the first color conversion particles 207a' are configured to convert light of the first color into light of the second color, and the second color conversion particles 207b' are configured to convert light of the first color into light of the third color, the light transmitting pattern 207c is configured to allow light of the first color to pass through, and the scattering particles 207c' included in the light transmitting pattern 207c can scatter the light of the first color incident in the light transmitting pattern 207c.

For example, the light transmitting pattern 207c further includes a light transmitting matrix in which scattering particles 207c' are distributed, and the matrix includes a transparent resin, and a material of the scattering particles 207c' includes a transparent metal oxide. The main function of the light transmitting pattern 207c is to disperse the light of the first color, so that it can match the light of the second color at all angles.

For example, as illustrated by FIG. 2, the color film layer 210 includes a first color film pattern 210a, a second color film pattern 20b and a third color film pattern 210c, and an orthographic projection of the first color film pattern 210a on the first base substrate 201 and an orthographic projection of the first color conversion pattern 207a on the first base substrate 201 are at least partially overlapped with each other, an orthographic projection of the second color film pattern 210b on the first base substrate 201 and an orthographic projection of the second color conversion pattern 207b on the first base substrate 201 are at least partially overlapped with each other, and an orthographic projection of the third color film pattern 210c on the first base substrate 201 and an orthographic projection of the light transmitting pattern 207c on the first base substrate 201 are at least partially overlapped with each other. Therefore, the first color film pattern 210a, the second color film pattern 210b and the third color film pattern 210c can further filter the light emitted from the first color conversion pattern 207a, the second color conversion pattern 207b and the light transmitting pattern 207c, respectively.

For example, in an example, the light extraction layer 208 includes a single-layer structure or a multi-layer structure that a plurality of layers are stacked, and in the structure shown in FIG. 2, the light extraction layer 208 includes a single-layer structure. The light extraction layer 208 includes a plurality of light extraction patterns 208a. For example, in FIG. 2, a cross-sectional shape of a portion of the light extraction layer 208 away from the first base substrate 201 is triangular, and the triangular portion is a light extraction pattern 208a, and the light extraction pattern 208a can refract light incident therein.

For example, a first inorganic encapsulation layer 203, an organic encapsulation layer 204 and a second inorganic encapsulation layer 205 are arranged at a side of the light emitting element layer 202 away from the base substrate 201, and the plurality of color conversion patterns 207a/207b and the light transmitting patterns 207c are arranged at a side of the second inorganic encapsulation layer 205 away from the base substrate 201.

Figure 3:
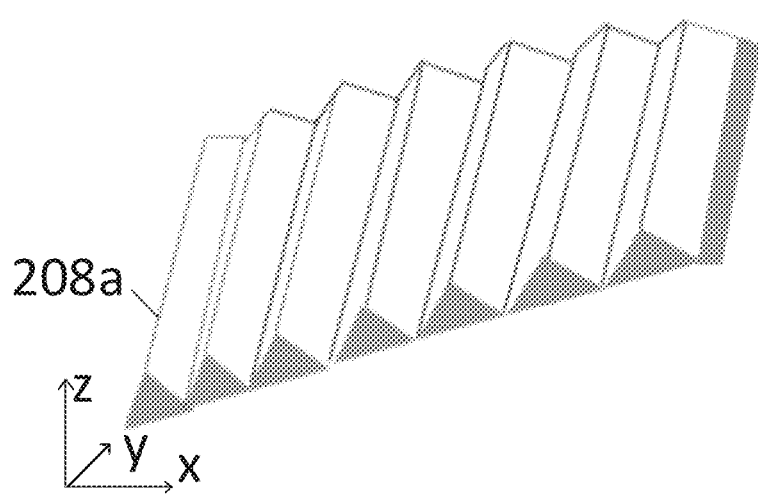
FIG. 3 is a schematic diagram of a three-dimensional structure of a light extraction layer with a single-layer structure provided by at least one embodiment of the present disclosure.

For example, FIG. 3 is a schematic diagram of a three-dimensional structure of a light extraction layer with a single-layer structure provided by at least one embodiment of the present disclosure. As illustrated by FIG. 2 and FIG. 3, the plurality of light extraction patterns 208a are arranged along a first direction, that is, along an extending direction of the x axis in FIG. 2 and FIG. 3, and each extends along a second direction, that is, along an extending direction of the y axis in FIG. 2 and FIG. 3. The first direction x and the second direction y are intersected with each other, and a direction perpendicular to the plane where the first direction x and the second direction y are located is a third direction, for example, the third direction is the direction in which the z axis extends in FIG. 2 and FIG. 3.

Figure 4:
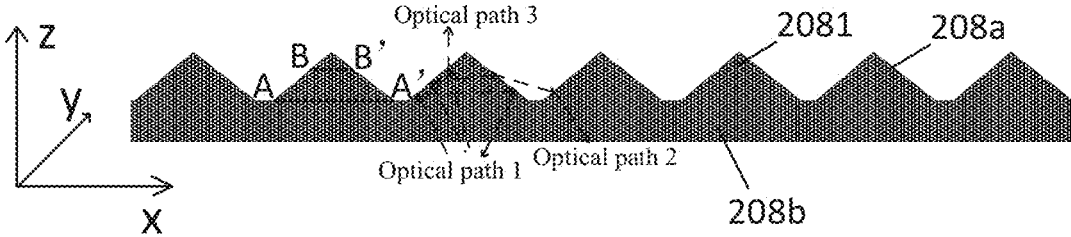
FIG. 4 is a schematic cross-sectional view of the light extraction layer shown in FIG. 2 on a plane where a first direction and a third direction are located.

For example, FIG. 4 is a schematic cross-sectional structure of the light extraction layer shown in FIG. 2 on a plane where a first direction and a third direction are located. Along the third direction z, a size of a portion of each of the light extraction patterns 208a close to the first base substrate 201 in the first direction x is larger than a size of a portion of the light extraction pattern 208a away from the first base substrate 201 in the first direction x, that is, in FIG. 4, a size A-A' of a portion of the light extraction pattern 208a close to the first base substrate 201 in the first direction x is larger than a size B-B' of a portion of the light extraction pattern 208a away from the first base substrate 201 in the first direction x, so that the light incident on a side edge of the light extraction pattern 208a can be reflected to the other side edge, and finally the light incident on the light extraction pattern 208a can be converged.

For example, in an example, from a position away from the first base substrate 201 to a position close to the first base substrate 201, a size of each of the light extraction patterns 208a in the first direction x gradually increases, or first decreases and then increases, which is not limited by the embodiment of the present disclosure.

For example, the area of a cross-section of the light extraction pattern 208a close to the first base substrate 201 on a plane where the first direction x and the second direction y are located is larger than the area of a cross-section of the light extraction pattern 208a away from the first base substrate 201 on the plane where the first direction x and the second direction y are located, that is, the closer to the first base substrate 201, the larger the area of the cross-section of the light extraction pattern 208a on the plane where the first direction x and the second direction y are located.

For example, as illustrated by FIG. 4, the light extraction layer 208 further includes a substrate 208b arranged continuously, and a plurality of light extraction patterns 208a are arranged at a side of the substrate 208b away from the first base substrate 201. The light extraction patterns 208a include convex structures 2081 which are continuous along the first direction x, the convex structures 2081 are arranged along the first direction x and extend along the second direction y, and the convex structures 2081 protrude out of the substrate 208a along the third direction z. Combined FIG. 2 with FIG. 4, an orthographic projection of the first color conversion pattern 207a on the first base substrate 201, an orthographic projection of the second color conversion pattern 207b on the first base substrate 201 and an orthographic projection of the light transmitting pattern 207c on the first base substrate 201 are respectively coincided with orthographic projections of the convex structures 2081 corresponding to the first color conversion pattern 207a, the second color conversion pattern 207b and the light transmitting pattern 207c on the first base substrate 201. The plurality of light extraction patterns 208a and the substrate 208b are integrated as an integrated structure, and the orthographic projection of the first color conversion pattern 207a on the first base substrate 201, the orthographic projection of the second color conversion pattern 207b on the first base substrate 201 and the orthographic projection of the light transmitting pattern 207c on the first base substrate 201 are all within the orthographic projection of the light extraction layer 208 on the first base substrate 201.

For example, in an example, one convex structure 2081 corresponds to a row of sub-pixels or a column of sub-pixels, and each row of sub-pixels corresponds to a light emitting element.

It should be noted that the light extraction pattern 208a may not include the convex structures 2081, and may be replaced by other structures that can converge light. The embodiment of the present disclosure is not limited thereto, as long as the light extraction pattern can converge light incident thereon.

For example, in an example, on the plane where the first direction x and the third direction z are located, a cross-sectional shape of a structure connected by the plurality of light extraction patterns 208a includes at least one of saw-tooth and wave. In the structure shown in FIG. 4, the cross-sectional shape of the structure connected by the plurality of light extraction patterns 208a is sawtooth, and propagation directions of light can be optical path 1, optical path 2 and optical path 3 in FIG. 4. The plurality of light extraction patterns 208a converge the light incident therein, or reflect the light incident in the light extraction patterns 208a into the substrate 208b, and then exit from the substrate 208b to a side of the light extraction layer 208 close to the first base substrate 201, so that this part of light can subsequently enter the light extraction layer 208 to avoid the loss of this part of light.

Figure 5:
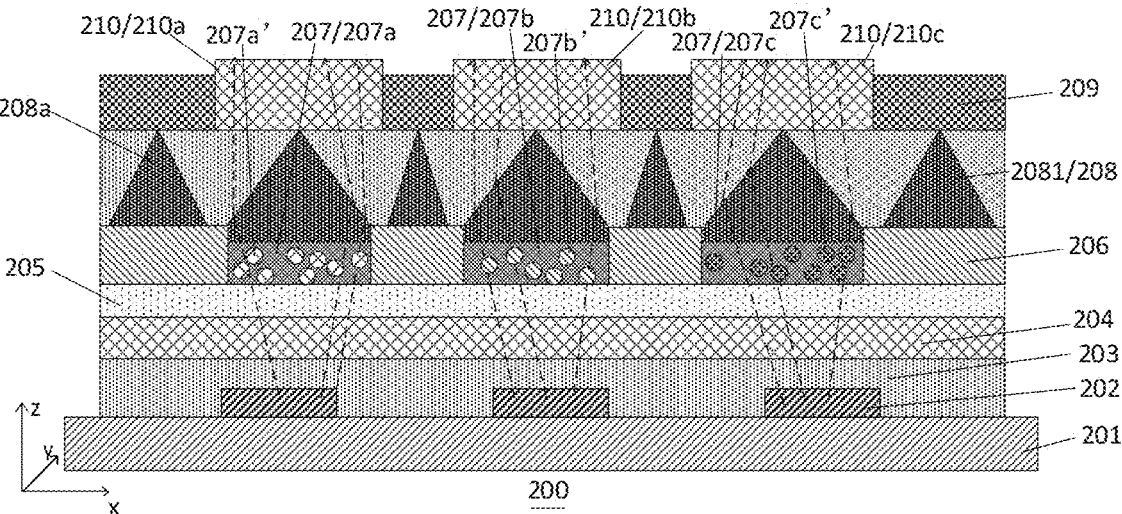
FIG. 5 is a schematic cross-sectional view of another display panel provided by at least one embodiment of the present disclosure.

For example, FIG. 5 is a schematic cross-sectional structure diagram of another display panel provided by at least one embodiment of the present disclosure. As illustrated by FIG. 5, on the plane of the first direction x and the third direction z, the cross-sectional shape of the light extraction pattern 208a includes a sawtooth, and the triangle included in the sawtooth is a non-right-angled isosceles triangle. It should be noted that, the sawtooth can also include a right-angled isosceles triangle, or a structure in which a non-right-angled isosceles triangle and an equilateral triangle are mixed. FIG. 5 is described by taking the case that the sawtooth includes the structure in which the non-right-angled isosceles triangle and the equilateral triangle are mixed as an example. As illustrated by FIG. 5, the cross-sectional shape of the light extraction pattern 208a in the regions corresponding to the first color conversion pattern 207a, the second color conversion pattern 207b and the light transmitting pattern 207c includes an equilateral triangle, and the cross-sectional shape of the light extraction pattern 208a at a position outside the regions corresponding to the first color conversion pattern 207a, the second color conversion pattern 207b and the light transmitting pattern 207c includes a non-right-angled isosceles triangle. For example, in the first direction x, an edge length of a base edge of the equilateral triangle close to the first base substrate 201 and a size of side of a corresponding one of the first color conversion pattern 207a, the second color conversion pattern 207b or the light transmitting pattern 207c in a direction parallel to the base edge are equal or substantially equal, so that all the light emitted from the first color conversion pattern 207a, the second color conversion pattern 207b or the light transmitting pattern 207c can enter the corresponding light extraction pattern 208a, so that the purity of the finally formed light is higher.

For example, as illustrated by FIG. 5, a ratio of a number of convex structures corresponding to the light extraction pattern 208a to a sum of a number of the first color conversion pattern 207a, a number of the second color conversion pattern 207b and a number of the light transmitting pattern 207c is 2:1, and each one of the first color conversion pattern 207a, the second color conversion pattern 207b and the light transmitting pattern 207c corresponds to one equilateral triangle. In the first direction x, adjacent first color conversion patterns 207a and second color conversion patterns 207b, adjacent first color conversion patterns 207a and light transmitting patterns 207c, and adjacent second color conversion patterns 207b and light transmitting patterns 207c are separated by a first black matrix 206, respectively; each of the first black matrix 206 corresponds to a non-right-angled isosceles triangle. For example, in FIG. 5, the edge length of the base edge of each equilateral triangle may be equal or unequal, and the edge length of the base edge of each non-right-angled isosceles triangle may be equal or unequal. For example, other structures of the display panel shown in FIG. 5 can be found in the above descriptions about FIG. 2, and the repeated portions will be omitted herein.

Figure 6:
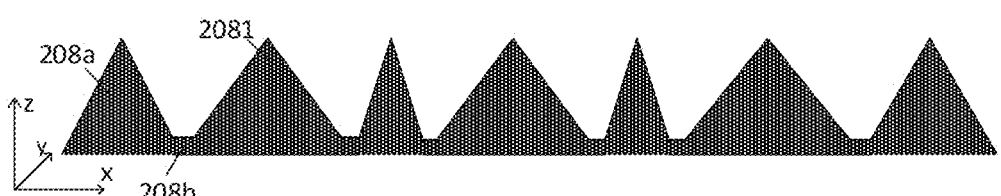
FIG. 6 is a schematic cross-sectional view of the light extraction layer shown in FIG. 5 on a plane where a first direction and a third direction are located.

For example, FIG. 6 is a schematic cross-sectional view of the light extraction layer shown in FIG. 5 in the plane where the first direction and the third direction are located. As illustrated by FIG. 6, the light extraction layer 208 further includes a substrate 208b arranged continuously, and a plurality of light extraction patterns 208a are arranged at a side of the substrate 208b away from the first base substrate 201. The light extraction patterns 208a include convex structures 2081 which are continuous along the first direction x, and the convex structures 2081 are arranged along the first direction x, each of the convex structures 2081 extends along the first direction x, and the convex structures 2081 protrude out of the substrate 208b along the third direction z. Along the first direction x, two sides of the convex structure 2081 having a cross-sectional shape of an equilateral triangle are provided with non-right-angled isosceles triangles, that is, the cross-sectional shape of the light extraction pattern 208a includes irregular sawtooth. For a schematic diagram of light propagation, please refer to the above-mentioned descriptions about FIG. 2, and the repeated portions are omitted herein.

For example, in combination with FIG. 5 and FIG. 6, the orthographic projection of the first color conversion pattern 207a on the first base substrate 201, the orthographic projection of the second color conversion pattern 207b on the first base substrate 201 and the orthographic projection of the light transmitting pattern 207c on the first base substrate 201 are coincided with orthographic projections of the convex structures 2081 corresponding to the first color conversion pattern 207a, the second color conversion pattern 207b and the light transmitting pattern 207c on the first base substrate 201, respectively. The plurality of light extraction patterns 208a and the substrate 208b are integrated as an integrated structure, and the orthographic projection of the first color conversion pattern 207a on the first base substrate 201, the orthographic projection of the second color conversion pattern 207b on the first base substrate 201, and the orthographic projection of the light transmitting pattern 207c on the first base substrate 201 are all within the orthographic projection of the light extraction layer 208 on the first base substrate 201.

Figure 7:
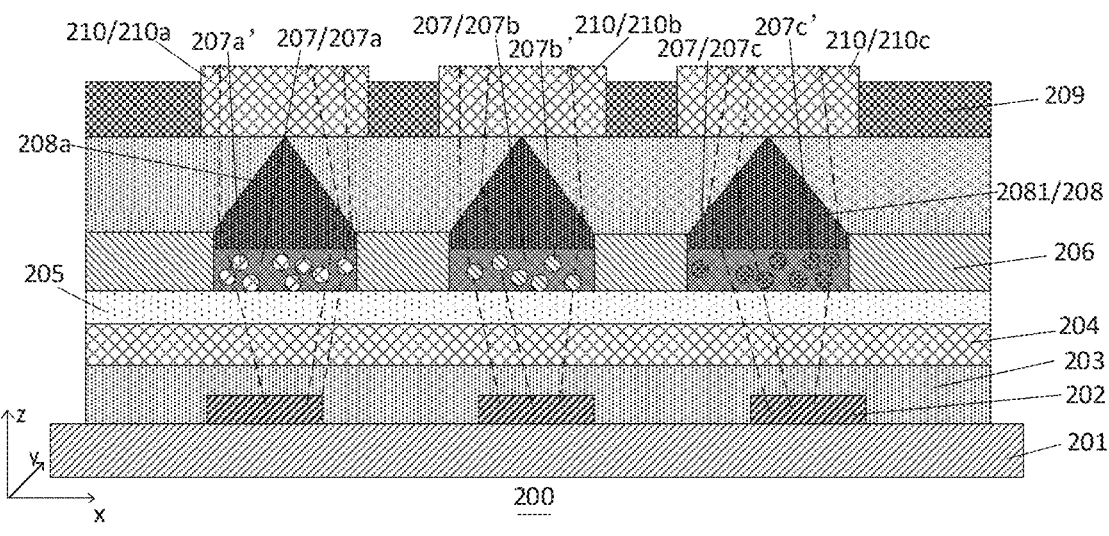
FIG. 7 is a schematic cross-sectional view of another display panel provided by at least one embodiment of the present disclosure.

For example, FIG. 7 is a schematic cross-sectional structure diagram of another display panel provided by at least one embodiment of the present disclosure. As illustrated by FIG. 7, a ratio of a number of convex structures corresponding to the light extraction pattern 208a to a sum of a number of the first color conversion pattern 207a, a number of the second color conversion pattern 207b and a number of the light transmitting pattern 207c is 1:1, and each one of the first color conversion pattern 207a, the second color conversion pattern 207b and the light transmitting pattern 207c corresponds to one convex structure, that is, the position corresponding to the first black matrix 206 is not provided with the convex structure. For other structures of the display panel shown in FIG. 7, please refer to the above descriptions about FIG. 2, and the repeated portions are omitted herein.

Figure 8:
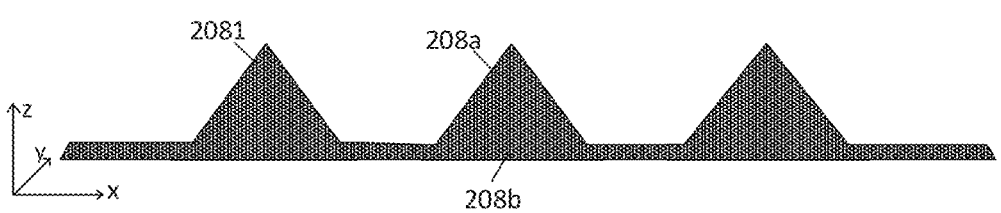
FIG. 8 is a schematic cross-sectional view of the light extraction layer shown in FIG. 7 on a plane where a first direction and a third direction are located.

For example, FIG. 8 is a schematic cross-sectional view of the light extraction layer shown in FIG. 7 on a plane where the first direction and the third direction are located. As illustrated by FIG. 8, the light extraction layer 208 further includes a substrate 208b arranged continuously, and a plurality of light extraction patterns 208a are arranged at a side of the substrate 208b away from the first base substrate 201. The light extraction patterns 208a include convex structures 2081 which are discontinuous along the first direction x, the convex structures 2081 are arranged along the first direction x, the convex structures 2081 extend along the second direction y, and the convex structures 2081 extend from the substrate 208b along the third direction z. Along the first direction x, the convex structures 2081 having the cross-sectional shape of an equilateral triangle are arranged at intervals, that is, at least two convex structures 2081 are provided with a first spacing region 2081a therebetween. FIG. 8 shows that any two adjacent convex structures 2081 are provided with a first spacing regions 2081a therebetween. With reference to FIG. 7 and FIG. 8, in the first direction x, the first color conversion pattern 207a and the second color conversion pattern 207b which are adjacent to each other, the first color conversion pattern 207a and the light transmitting pattern 207c which are adjacent to each other, and the second color conversion pattern 207b and the light transmitting pattern 207c which are adjacent to each other are spaced apart by first black matrixes 206, respectively; in the first direction x, the first black matrixes 206 and the first spacing regions 2081a are in one-to-one correspondence, which can reduce the preparation difficulty of the light extraction pattern 208a.

For example, it should be noted that the one-to-one correspondence between the first black matrixes 206 and the first spacing regions 2081a refers to that the number of the first black matrixes 206 and the number of the first spacing regions 2081a are the same, and they are in one-to-one correspondence in the upper and lower positions, and the orthographic projections of the first black matrixes 206 on the first base substrate 201 and the orthographic projections of the first spacing regions 2081a on the first base substrate 201 are in one-to-one correspondence. Unless otherwise specified, in the embodiment of the present disclosure, the one-to-one correspondence refers to the one-to-one correspondence relationships in the numbers, positions, and orthographic projections on the first base substrate.

For example, in combination with FIG. 7 and FIG. 8, the orthographic projection of the first color conversion pattern 207a on the first base substrate 201, the orthographic projection of the second color conversion pattern 207b on the first base substrate 201 and the orthographic projection of the light transmitting pattern 207c on the first base substrate 201 are coincided with orthographic projections of the convex structures 2081 corresponding to the first color conversion pattern 207a, the second color conversion pattern 207b and the light transmitting pattern 207c on the first base substrate 201, respectively. The plurality of light extraction patterns 208a and the substrate 208b are integrated as an integrated structure, and the orthographic projection of the first color conversion pattern 207a on the first base substrate 201, the orthographic projection of the second color conversion pattern 207b on the first base substrate 201 and the orthographic projection of the light transmitting pattern 207c on the first base substrate 201 are all within the orthographic projection of the light extraction layer 208 on the first base substrate 201.

Figure 9:
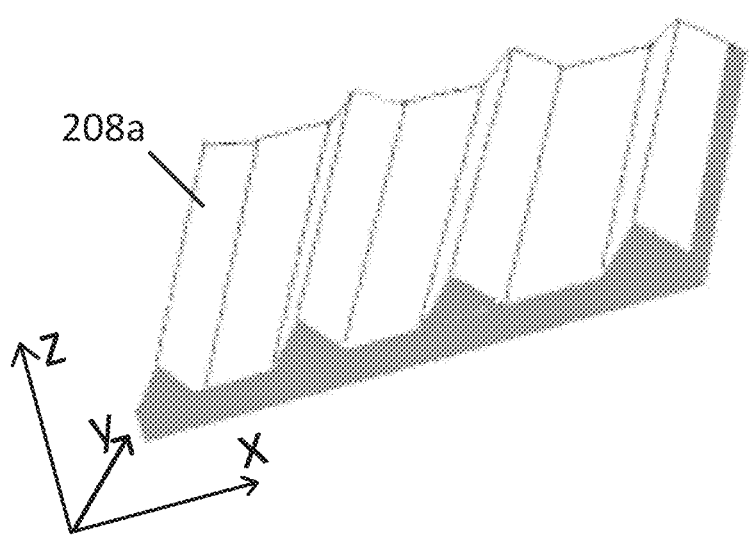
FIG. 9 is a schematic diagram of a three-dimensional structure of another light extraction layer with a single-layer structure provided by at least one embodiment of the present disclosure.

For example, FIG. 9 is a schematic diagram of a three-dimensional structure of another light extraction layer with a single-layer structure provided by at least one embodiment of the present disclosure. As illustrated by FIG. 7 and FIG. 9, the plurality of light extraction patterns 208a are arranged along a first direction, that is, along an extending direction of the x axis, and each of the light extraction patterns 208a extends along a second direction, that is, extends along an extending direction of the y axis.

Figure 10:
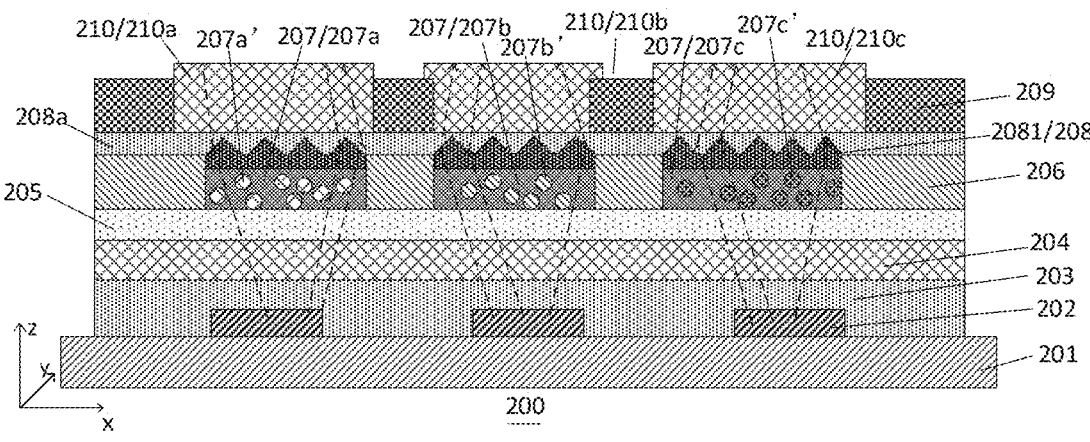
FIG. 10 is a schematic cross-sectional view of another display panel provided by at least one embodiment of the present disclosure.

For example, FIG. 10 is a schematic cross-sectional structure diagram of another display panel provided by at least one embodiment of the present disclosure. As illustrated by FIG. 10, on a plane where the first direction x and the third direction z are located, a cross-sectional shape of the light extraction pattern 208a includes sawtooth, and the triangles included in the sawtooth include equilateral triangles, and in the first direction x, a sum of edge lengths of base edges of four equilateral triangles is equal to a size of the first color conversion pattern 207a or the second color conversion pattern 207b in a direction parallel to the base edges, and a sum of edge lengths of base edges of five equilateral triangles is equal to a size of the light transmitting pattern 207c in a direction parallel to the base edges. That is, a ratio of the number of the convex structures 2081 to the number of the corresponding first color conversion patterns 207a is 4:1, a ratio of the number of the convex structures 2081 to the number of the corresponding second color conversion patterns 207b is 4:1, and a ratio of the number of the convex structures 2081 to the number of the corresponding light transmitting patterns 207c is 5:1. Compared with the example in which the ratio of the number of convex structures 2081 to the number of corresponding first color conversion patterns 207a is 1:1, the ratio of the number of convex structures 2081 to the number of corresponding second color conversion patterns 207b is 1:1, and the ratio of the number of convex structures 2081 to the number of corresponding light transmitting patterns 207c is 1:1, the case that the first color conversion pattern 207a, the second color conversion pattern 207b and the light transmitting pattern 207c correspond to multiple convex structures 2081 can make the light incident in the light extraction layer 208 be refracted by more times, so that the light can be fully utilized.

It should be noted that the ratio of the number of convex structures 2081 to the number of corresponding first color conversion patterns 207a, the ratio of the number of the convex structures 2081 to the number of the corresponding second color conversion patterns 207b, and the ratio of the number of the convex structures 2081 to the number of the corresponding light transmitting patterns 207c can also be other ratios. For example, the ratio of the number of the convex structures 2081 to the number of the corresponding first color conversion patterns 207a is n:1, for example, 1:1, 2:1, 3:1, 5:1 or 6:1, as long as n is greater than or equal to 1 and less than or equal to 50. The ratio of the number of the convex structures 2081 to the number of the corresponding second color conversion patterns 207b is n:1, for example, 1:1, 2:1, 3:1, 5:1 or 6:1, as long as n is greater than or equal to 1 and less than or equal to 50. The ratio of the number of the convex structures 2081 to the number of the corresponding light transmitting patterns 207c is n:1, for example, 1:1, 2:1, 3:1, 4:1 or 6:1, as long as n is greater than or equal to 1 and less than or equal to 50, the embodiment of the present disclosure is not limited thereto.

Figure 11:
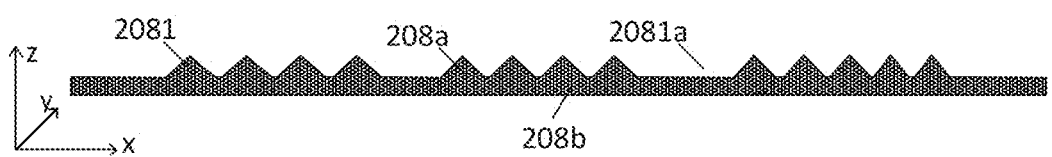
FIG. 11 is a schematic cross-sectional view of the light extraction layer shown in FIG. 10 on a plane where a first direction and a third direction are located.

For example, FIG. 11 is a schematic cross-sectional view of the light extraction layer shown in FIG. 10 on a plane where the first direction and the third direction are located. As illustrated by combination with FIG. 10 and FIG. 11, the light extraction layer 208 further includes a substrate 208b arranged continuously, and a plurality of light extraction patterns 208a are arranged at a side of the substrate 208b away from the first base substrate 201, and the light extraction pattern 208a includes convex structures 2081 which are discontinuous along the first direction x, the convex structures 2081 are arranged along the first direction x, each of the convex structures 2081 extends along the second direction y, and the convex structures 2081 protrude out of the substrate 208b along the third direction z. Along the first direction x, four convex structures 2081 with the cross-section of an equilateral triangle are continuously arranged to form a first group of convex structures and correspond to the first color conversion pattern 207a. The four convex structures 2081 with the cross-section of an equilateral triangle are continuously arranged to form a second group of convex structures and correspond to the second color conversion pattern 207b. Five convex structures 2081 with the cross-section of an equilateral triangle are continuously arranged to form a third group of convex structures and correspond to the light transmitting pattern 207c. The first group of convex structures, the second group of convex structures and the third group of convex structures are all provided with a first spacing region 2081a therebetween. In the first direction x, the adjacent first color conversion pattern 207a and second color conversion pattern 207b, the adjacent first color conversion pattern 207a and light transmitting pattern 207c, and the adjacent second color conversion pattern 207b and light transmitting pattern 207c are spaced apart by a first black matrix 206, respectively, and in the first direction x, the first black matrix 206 and the first spacing region 2081a are in one-to-one correspondence, and the arrangement can reduce the preparation difficulty of the light extraction pattern 208a.

For example, as illustrated by FIG. 11, the orthographic projection of the first color conversion pattern 207a on the first base substrate 201, the orthographic projection of the second color conversion pattern 207b on the first base substrate 201 and the orthographic projection of the light transmitting pattern 207c on the first base substrate 201 are coincided with the orthographic projections of a plurality of convex structures 2081 corresponding to the first color conversion pattern 207*a*, the second color conversion pattern 207*b*, and the light transmitting pattern 207*c* on the first base substrate 201, respectively. The plurality of convex structures 2081 and the substrate 208*b* are integrated as an integrated structure, and the orthographic projection of the first color conversion pattern 207*a* on the first base substrate 201, the orthographic projection of the second color conversion pattern 207*b* on the first base substrate 201 and the orthographic projection of the light transmitting pattern 207*c* on the first base substrate 201 are all within the orthographic projection of the light extraction layer 208 on the first base substrate 201.

Figure 12:
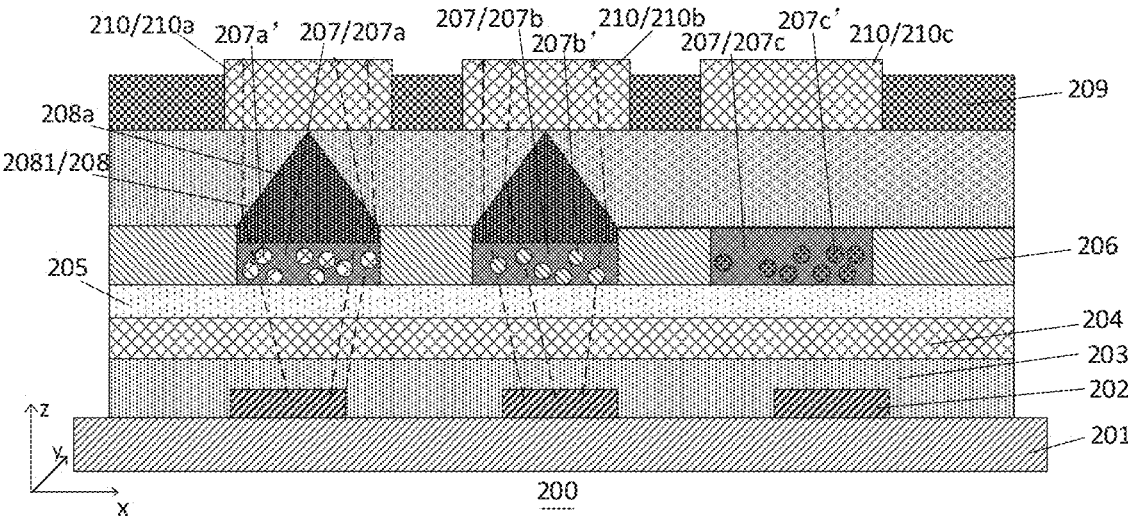
FIG. 12 is a schematic cross-sectional view of another display panel provided by at least one embodiment of the present disclosure.

For example, FIG. 12 is a schematic cross-sectional structure diagram of another display panel provided by at least one embodiment of the present disclosure. As illustrated by FIG. 12, a ratio of the number of convex structures corresponding to the light extraction pattern 208*a* to a sum of the number of the first color conversion pattern 207*a* and the number of the second color conversion pattern 207*b* is 1:1, and there is no convex structure at the position corresponding to the first black matrix 206 and the position corresponding to the light transmitting pattern 207*c*. For example, in an example, the convex structures are in one-to-one correspondence with the first color conversion pattern 207*a* and the second color conversion pattern 207*b*. For other structures of the display panel shown in FIG. 12, please refer to the above descriptions about FIG. 2, and the repeated portions are omitted herein.

Figure 13:
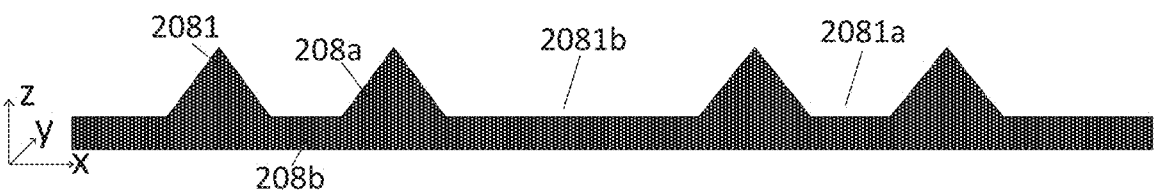
FIG. 13 is a schematic cross-sectional view of the light extraction layer shown in FIG. 12 on a plane where a first direction and a third direction are located.

For example, FIG. 13 is a schematic cross-sectional view of the light extraction layer shown in FIG. 12 on a plane where the first direction and the third direction are located. As illustrated by FIG. 13, the light extraction layer 208 further includes a substrate 208*b* arranged continuously, and a plurality of light extraction patterns 208*a* are arranged at a side of the substrate 208*b* away from the first base substrate 201, and the light extraction pattern 208*a* includes convex structures 2081 which are discontinuous along the first direction x, the convex structures 2081 are arranged along the first direction x, and each of the convex structures 2081 extends along the second direction y, and the convex structures 2081 protrude out of the substrate 208*b* along the third direction z. Along the first direction x, the convex structures 2081 with the cross-section of a triangular shape are arranged at intervals. FIG. 13 shows that any two convex structures 2081 are provided with a first spacing region 2081*a* or 2081*b* therebetween. With reference to FIG. 12 and FIG. 13, in the first direction x, the adjacent first color conversion pattern 207*a* and second color conversion pattern 207*b*, the adjacent first color conversion pattern 207*a* and light transmitting pattern 207*c*, and the adjacent second color conversion pattern 207*b* and light transmitting pattern 207*c* are spaced apart by a first black matrix 206, and, in the first direction x, the first spacing region 2081*a* is a region corresponding to the first black matrix 206 between the first color conversion pattern 207*a* and the second color conversion pattern 207*b*. The second spacing region 2081*b* is a region corresponding to the first black matrix 206 and the light transmitting pattern 207*c*, which are adjacent to each other, between the first color conversion pattern 207*a* and the second color conversion pattern 207*b*.

For example, in combination with FIG. 12 and FIG. 13, the orthographic projection of the first color conversion pattern 207*a* on the first base substrate 201 and the orthographic projection of the second color conversion pattern 207*b* on the first base substrate 201 are coincided with the orthographic projections of the convex structures 2081 corresponding to the first color conversion pattern 207*a* and the second color conversion pattern 207*b* on the first base substrate 201, respectively. The plurality of light extraction patterns 208*a* and the substrate 208*b* have an integrated structure, and the orthographic projection of the first color conversion pattern 207*a*, the orthographic projection of the second color conversion pattern 207*b* and the orthographic projection of the light transmitting pattern 207*c* on the first base substrate 201 are all within the orthographic projection of the light extraction layer 208 on the first base substrate 201.

Figure 14:
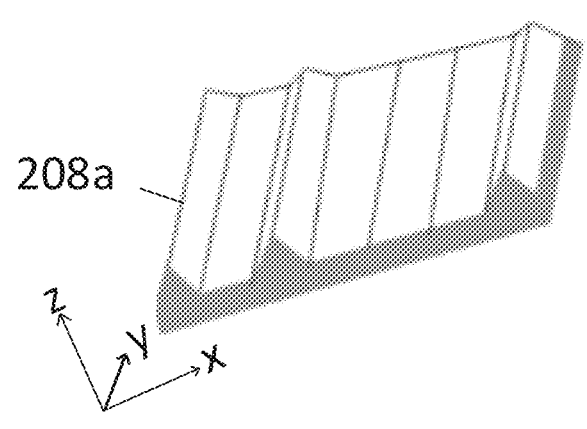
FIG. 14 is a schematic diagram of a three-dimensional structure of another light extraction layer with a single-layer structure provided by at least one embodiment of the present disclosure.

For example, FIG. 14 is a schematic diagram of a three-dimensional structure of another light extraction layer with a single-layer structure provided by at least one embodiment of the present disclosure. As illustrated by FIG. 12 and FIG. 14, the plurality of light extraction patterns 208*a* are arranged along a first direction, that is, along an extending direction of the x axis, and each of the light extraction patterns 208*a* extends along a second direction, that is, extends along an extending direction of the y axis of the FIG. 14.

Figure 15:
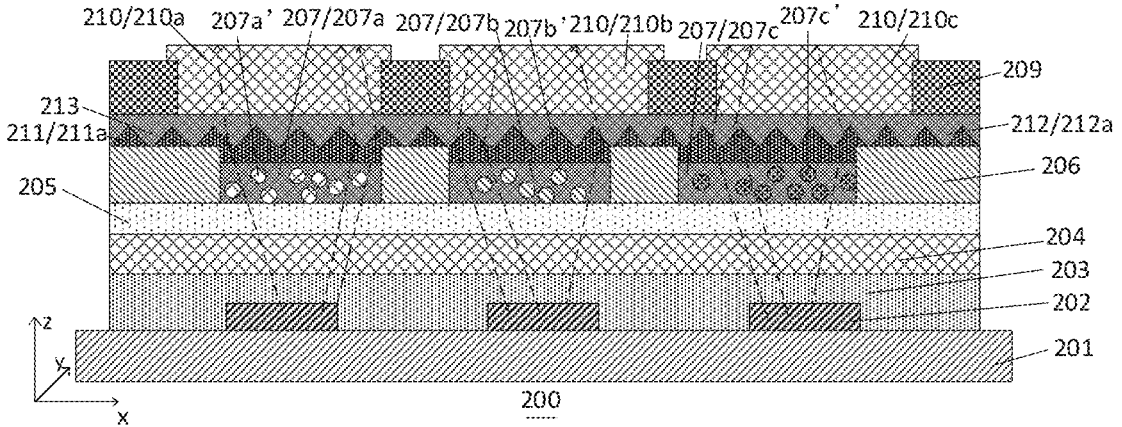
FIG. 15 is a schematic cross-sectional view of another display panel provided by an embodiment of the present disclosure.
Figure 16:
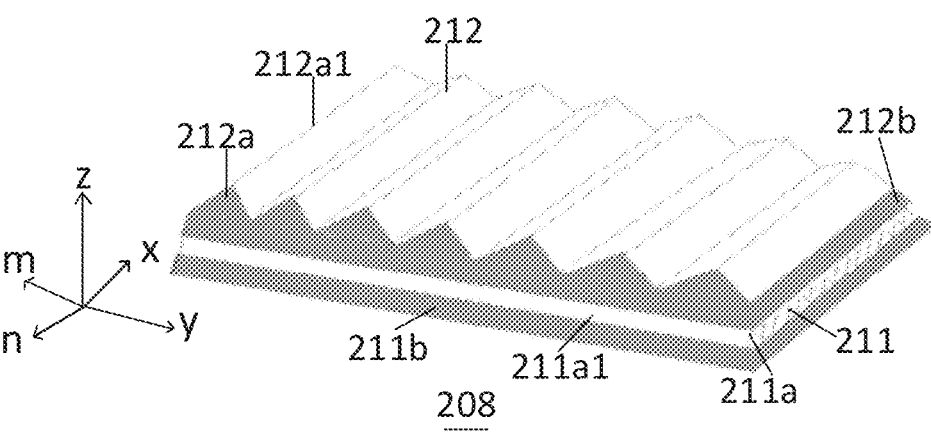
FIG. 16 is a schematic view of the three-dimensional structure of the light extraction layer with a multi-layer structure shown in FIG. 15.

For example, FIG. 15 is a schematic diagram of a cross-sectional structure of another display panel provided by an embodiment of the present disclosure, and FIG. 16 is a schematic diagram of a three-dimensional structure of a light extraction layer with a multi-layer structure shown in FIG. 15. As illustrated by FIG. 15 and FIG. 16, the light extraction layer 208 is a multi-layer structure, and FIG. 15 and FIG. 16 are described by taking the case that the multi-layer structure is a two-layer structure as an example, and the light extraction layer 208 includes a first light extraction layer 211 and a second light extraction layer 212 which are stacked, the first light extraction layer 211 includes a plurality of first light extraction patterns 211*a*, the plurality of first light extraction patterns 211*a* are arranged along the first direction x and each of the first light extraction patterns 211*a* extends along the second direction y. A direction perpendicular to the plane where the first direction x and the second direction y are located is a third direction z, and the first direction x and the second direction y are intersected with each other. Along the third direction z, a size of a portion of each of the first light extraction patterns 211*a* close to the first base substrate 201 in the first direction x is larger than a size of a portion of each of the first light extraction patterns 211*a* away from the first base substrate 201 in the first direction x. The second light extraction layer 212 includes a plurality of second light extraction patterns 212*a*, the plurality of second light extraction patterns 212*a* are arranged along a fourth direction m and each of the second light extraction patterns 212*a* extends along a fifth direction n, a direction perpendicular to a plane where the fourth direction m and the fifth direction n are located is a third direction z, the fourth direction m and the fifth direction n are intersected with each other. Along the third direction z, a size of a portion of the second light extraction pattern 212*a* close to the first base substrate 201 in the fourth direction m is larger than a size of a portion of the second light extraction pattern 212*a* away from the first base substrate 201 in the fourth direction m.

It should be noted that the structures shown in FIG. 15 and FIG. 16 are described by taking the case that the first direction x and the fifth direction n are parallel, the second direction y and the fourth direction m are parallel, and on the plane where the first direction x and the fourth direction m are located, a surface of the first light extraction pattern 211*a* away from the first base substrate 201 is a sawtooth shape, and a surface of the second light extraction pattern 212*a* close to the first base substrate 201 is just arranged in a gap of the surface of the first light extraction pattern 211*a* away from the first base substrate 201 as an example; that is, the first light extraction layer 211 and the second light extraction layer 212 are orthogonal to each other in the structures shown in FIG. 15 and FIG. 16, and the embodiment of the present disclosure is not limited thereto, and the first light extraction layer 211 and the second light extraction layer 212 may also be non-orthogonal.

For example, as illustrated by FIG. 16, the first light extraction layer 211 further includes a first substrate 211*b* that is continuously arranged, and a plurality of first light extraction patterns 211*a* are arranged at a side of the first substrate 211*b* that is away from the first base substrate 201, and the first light extraction pattern 211*a* includes a plurality of first sawtooth portions 211*a*1 that are continuously arranged along the first direction x, the plurality of first sawtooth portions 211*a*1 are arranged along the first direction x, and each of the first sawtooth portions 211*a*1 extends along the second direction y. The second light extraction layer 212 further includes a second substrate 212*b* that is continuously arranged, and a plurality of second light extraction patterns 212*a* are arranged at a side of the second substrate 212*b* away from the first base substrate 201, and the second light extraction pattern 212*a* includes a plurality of second sawtooth portions 212*a*1 which are continuous along the fourth direction m, the plurality of second sawtooth portions 212*a*1 are arranged along the fourth direction m, and each of the second sawtooth portions 212*a*1 extends along the fifth direction n. An included angle between the second direction y and the fifth direction n ranges from 45° to 90°, for example, the included angle between the second direction y and the fifth direction n is 45°, 60°, 70°, 75°, 80°, 85° or 90°, which is not limited by the embodiment of the present disclosure.

For example, an included angle between an extending direction of the first sawtooth portion 211*a*1 and an extending direction of the second sawtooth portion 212*a*1 ranges from 45° to 90°.

Figure 17:
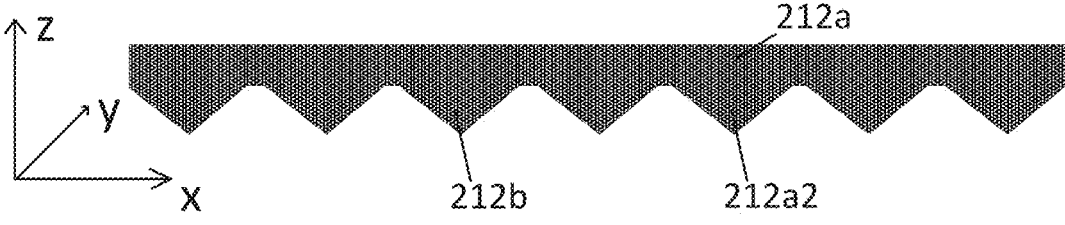
FIG. 17 is a schematic cross-sectional view of the second light extraction pattern in FIG. 16 on a plane formed by a first direction and a third direction.
Figure 18:
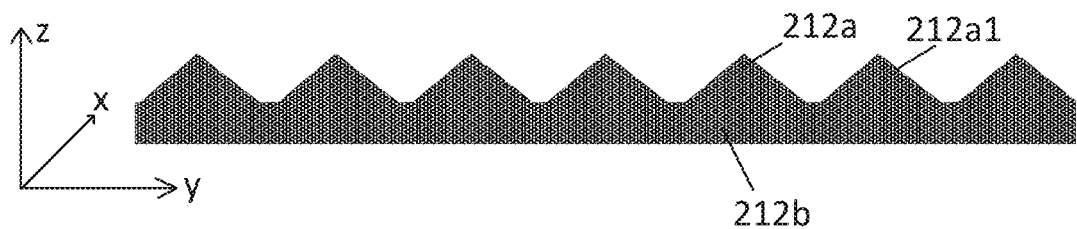
FIG. 18 is a schematic cross-sectional view of the second light extraction pattern in FIG. 16 on a plane formed by a second direction and a third direction.

For example, FIG. 16 is described by taking the case that the second light extraction pattern 212*a* is arranged at a side of the first light extraction layer 211 away from the first base substrate 201, the fourth direction m is parallel to the second direction y, and the fifth direction n is parallel to the first direction x as an example. FIG. 17 is a schematic cross-sectional view of the second light extraction pattern 212*a* in FIG. 16 on a plane formed by the first direction x and the third direction z, as illustrated by FIG. 17, a surface of the second light extraction pattern 212*a* close to the first base substrate 201 has a sawtooth shape, and the surface of the second light extraction pattern 212*a* close to the first base substrate 201 includes third sawtooth portions 212*a*2 arranged along the fifth direction n (or the first direction x), and each of the third sawtooth portions 212*a*2 extends along the fourth direction m (or the second direction y). FIG. 18 is a schematic cross-sectional view of the second light extraction pattern 212*a* in FIG. 16 on a plane formed by the second direction y and the third direction z. As illustrated by FIG. 18, a surface of the second light extraction pattern 212*a* away from the first base substrate 201 includes second sawtooth portions 212*a*1, and each of the second sawtooth portions 212*a*1 extends along the first direction x.

For example, the structure of the first light extraction layer 211 can refer to the descriptions of the light extraction layer with the single-layer structure described above, and the repeated portions are omitted herein.

For example, as illustrated by FIG. 15, a connection portion 213 is provided between the first light extraction layer 211 and the second light extraction layer 212. Combining with FIG. 15 and FIG. 17, the abovementioned third sawtooth portion 212*a*2 is the connection portion 213, which fills the spacing region between the first light extraction layer 211 and the second light extraction layer 212, and the first light extraction layer 211 is provided at a side of the second light extraction layer 212 close to the first base substrate 201. On the plane where the first direction x and the third direction z are located, a cross-sectional shape of the connection portion 213 is complementary to a cross-sectional shape of the first light extraction pattern 211*a*, that is, the cross-sectional shape of the connection portion 213 is an integral cross-sectional shape formed by the plurality of third sawtooth portions 212*a*2.

Alternatively, in another example, the second light extraction layer 212 is arranged at a side of the first light extraction layer 211 close to the first base substrate 201, and the cross-sectional shape of the connection portion 213 and the cross-sectional shape of the second light extraction pattern 212*a* are complementary on the plane where the fourth direction m and the third direction z are located.

Figure 19:
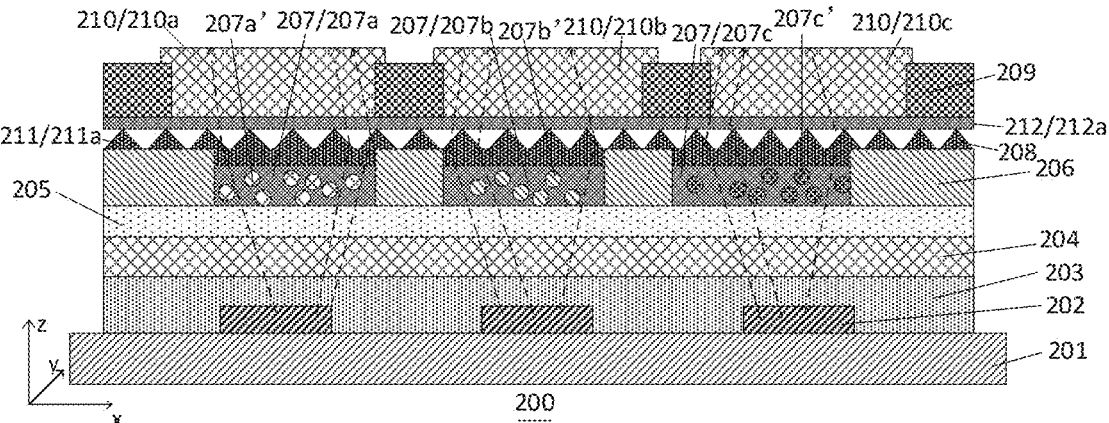
FIG. 19 is a schematic cross-sectional view of another display panel provided by an embodiment of the present disclosure.
Figure 20:
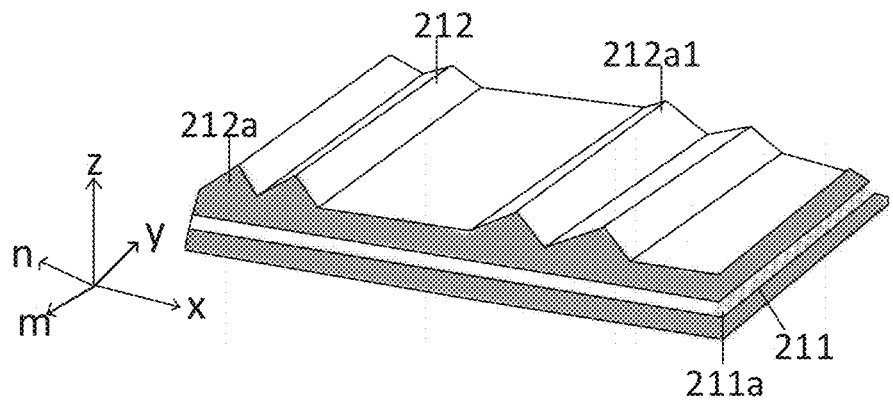
FIG. 20 is a schematic view of the three-dimensional structure of the light extraction layer with a multi-layer structure shown in FIG. 19.

For example, FIG. 19 is a schematic diagram of a cross-sectional structure of another display panel provided by an embodiment of the present disclosure, and FIG. 20 is a schematic diagram of a three-dimensional structure of a light extraction layer with a multi-layer structure shown in FIG. 19. As illustrated by FIG. 19 and FIG. 20, the light extraction layer 208 includes a multi-layer structure, and includes a first light extraction layer 211 and a second light extraction layer 212 which are stacked. The first light extraction layer 211 includes a first substrate 211*b* arranged continuously, and a plurality of first light extraction patterns 211*a* are arranged at a side of the first substrate 211*b* away from the first base substrate 201. The first light extraction pattern 211*a* includes a plurality of first sawtooth portions 211*a*1 which are continuous along the first direction x, the plurality of first sawtooth portions 211*a*1 are arranged along the first direction x, and each of the first sawtooth portions 211*a*1 extends along the second direction y. The second light extraction layer 212 further includes a second substrate 212*b* which is continuously arranged, and a plurality of second light extraction patterns 212*a* are arranged at a side of the second substrate 212*b* away from the first base substrate 201, and the second light extraction pattern 212*a* includes a plurality of second sawtooth portions 212*a*1 which are spaced apart along the fourth direction m, and a second spacing region 212*c* is arranged between adjacent second sawtooth portions 212*a*1, the plurality of second sawtooth portions 212*a*1 are arranged along the fourth direction m, each of the second sawtooth portions 212*a*1 extends along the fifth direction n, and an included angle between the second direction y and the fifth direction n ranges from 45° to 90°. FIG. 19 is described by taking the case that the included angle between the second direction y and the fifth direction n is 90°, and the included angle between the first direction x and the fourth direction m is 90° as an example. That is, FIG. 19 and FIG. 20 are described by taking the case that the included angle between the arrangement direction of the first sawtooth portions 211*a*1 and the arrangement direction of the second sawtooth portions 212*a*1 is 90°, and the included angle between the extending direction of the first sawtooth portion 211*a*1 and the extending direction of the second sawtooth portion 212*a*1 is 90° as an example.

For example, as illustrated by FIG. 19, the structure of the first light extraction layer 211 can refer to the related descriptions of the light extraction layer with the single-layer structure, and the repeated portions are omitted herein. In addition, FIG. 19 is described by taking the case that a surface of the first light extraction layer 211 away from the first base substrate 201 includes first sawtooth portions 211a1 which are continuously arranged as an example, and a gap between adjacent first sawtooth portions 211a1 is not filled by the second light extraction layer 212, that is, an air layer is formed between the first light extraction layer 211 and the first light extraction layer 201.

Figure 21:
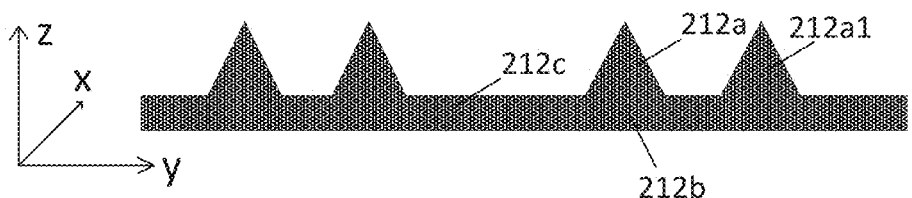
FIG. 21 is a schematic cross-sectional view of the second light extraction pattern in FIG. 19 on a plane formed by a second direction and a third direction.

For example, FIG. 21 is a schematic cross-sectional view of the second light extraction pattern 212a in FIG. 19 on the plane formed by the second direction y and the third direction z. As illustrated by FIG. 21, a surface of the second light extraction pattern 212a away from the first base substrate 201 includes second sawtooth portions 212al, and each of the second sawtooth portions 212a1 extends along the first direction x. In combination with FIG. 20 and FIG. 21, at least two second sawtooth portions 212a1 are provided with a second spacing region 212c therebetween.

For example, in combination with FIG. 19 and FIG. 20, the second light extraction layer 212 is at a side of the first light extraction layer 211 away from the first base substrate 201, and in the fourth direction n, the adjacent first color conversion pattern 207a and the second color conversion pattern 207b, the adjacent first color conversion pattern 207a and the light transmitting pattern 207c, and the adjacent second color conversion pattern 207b and the light transmitting pattern 207c are spaced apart by a first black matrix 206, respectively; and in the fourth direction n, the second spacing region 212c corresponds to a region directly above the first black matrix 206 and the light transmitting pattern 207c, which can reduce the preparation difficulty of the light extraction pattern 208a.

For example, as illustrated by FIG. 19, in the third direction z, a maximum thickness of the first black matrix 206 is greater than a maximum thickness of the first color conversion pattern 207a and a maximum thickness of the second color conversion pattern 207b, respectively. It should be noted that, a surface of the first black matrix 206 away from the first base substrate 201 may have an arc-shaped structure, so the maximum thickness is described herein.

For example, in an example, on a plane where the fourth direction n (the first direction x) and the third direction z are located, a cross-sectional shape of the second sawtooth portion 212a1 includes an equilateral triangle, and in an example, the cross-sectional shape of the second sawtooth portion 212a1 can also be a right-angled isosceles triangle or a non-equilateral and non-right-angled triangle. In the fourth direction n, a length edge of base edge of the equilateral triangle close to the first base substrate 201 is equal to or substantially equal to a size of a corresponding one of the first color conversion pattern 207a, the second color conversion pattern 207b or the light transmitting pattern 207c in a direction parallel to the base edge.

For example, in an example, an orthographic projection of the first color conversion pattern 207a on the first base substrate 201 is within an orthographic projection of the second sawtooth portion 212a1 corresponding to the first color conversion pattern 207a on the first base substrate 201, and an orthographic projection of the second color conversion pattern 207b on the first base substrate 201 is within an orthographic projection of the second sawtooth portion 212a1 corresponding to the second color conversion pattern 207b on the first base substrate 201, this example can refer to the related descriptions above, and the repeated portions are omitted herein. It should be noted that, the second sawtooth portion 212a1 corresponding to the first color conversion pattern 207a refers to the second sawtooth portion 212a1 at a side of the first color conversion pattern 207a away from the first base substrate 201 and the second sawtooth portion 212a1 at a side of the first black matrix 206 adjacent to the first color conversion pattern 207a away from the first base substrate 201; the second sawtooth portion 212a1 corresponding to the second color conversion pattern 207b refers to the second sawtooth portion 212a1 at a side of the second color conversion pattern 207b away from the first base substrate 201 and the second sawtooth portion 212a1 at a side of the first black matrix 206 adjacent to the second color conversion pattern 207b away from the first base substrate 201.

For example, in an example, a ratio of the number of the second sawtooth portions 212a1 to the number of the color conversion patterns (including the first color conversion pattern 207a and the second color conversion pattern 207b) is 1:1 or 2:1. This example can refer to the related descriptions mentioned above, and the repeated portions are omitted herein. In the case that the ratio of the number of the second sawtooth portions 212a1 to the number of the color conversion patterns is 1:1, two second sawtooth portions 212a1 may be provided on the surface of one of the first color conversion pattern 207a and the second color conversion pattern 207b away from the first base substrate 201, but no second sawtooth portions 212a1 is provided on the surface of the other one of the first color conversion pattern 207a and the second color conversion pattern 207b away from the first base substrate 201. Alternatively, the surfaces of the first color conversion pattern 207a and the second color conversion pattern 207b, which are away from the first base substrate 201, are respectively provided with one second sawtooth portion 212a1.

Figure 22:
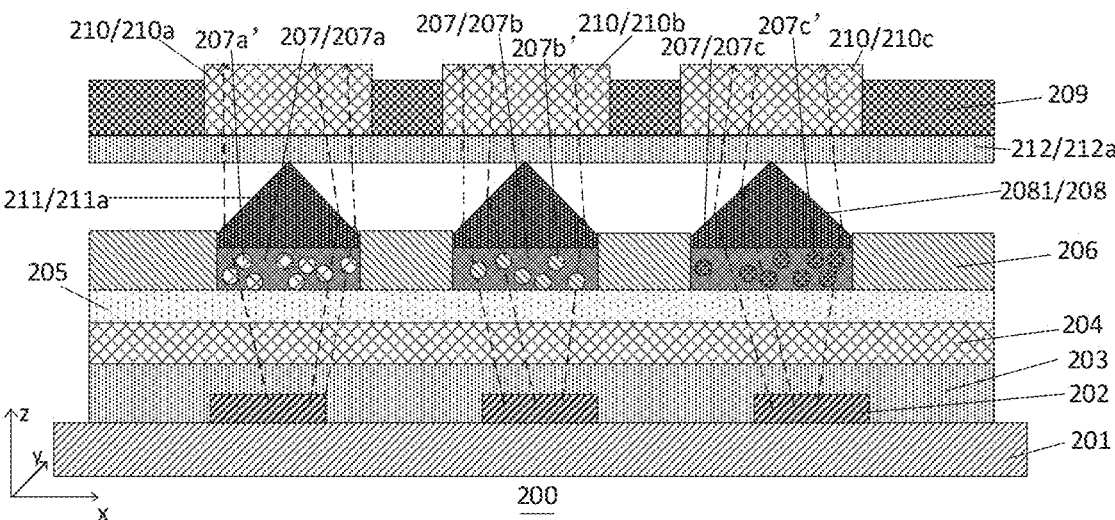
FIG. 22 is a schematic cross-sectional view of another display panel provided by an embodiment of the present disclosure.
Figure 23:
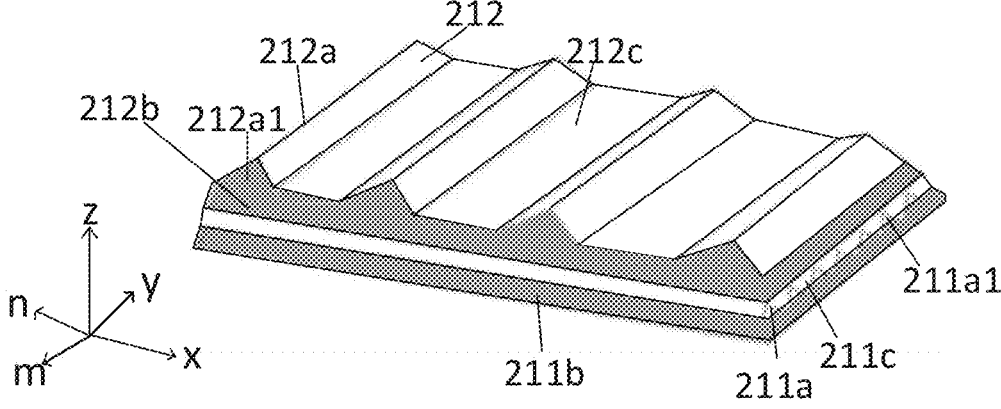
FIG. 23 is a schematic view of a three-dimensional structure of the light extraction layer with a multi-layer structure shown in FIG. 22.

For example, FIG. 22 is a schematic diagram of a cross-sectional structure of another display panel provided by an embodiment of the present disclosure, and FIG. 23 is a schematic diagram of a three-dimensional structure of a light extraction layer with a multi-layer structure shown in FIG. 22. As illustrated by FIG. 22 and FIG. 23, the light extraction layer 208 includes a multi-layer structure, and includes a first light extraction layer 211 and a second light extraction layer 212 which are stacked. The first light extraction layer 211 further includes a first substrate 211b arranged continuously, and a plurality of first light extraction patterns 211a are arranged at a side of the first substrate 211b away from the first base substrate 201. The first light extraction pattern 211a includes a plurality of first sawtooth portions 211a1 spaced apart along the first direction x, and a first spacing region 211c is arranged between adjacent first sawtooth portions 211a1, and the first sawtooth portions 211a1 are arranged along the first direction x, each of the first sawtooth portions 211a1 extends along the second direction y. The second light extraction layer 212 further includes a second substrate 212b which is continuously arranged, and a plurality of second light extraction patterns 212a are arranged at a side of the second substrate 212b away from the first base substrate 201. The second light extraction pattern 212a includes a plurality of second sawtooth portions 212a1 which are spaced apart along the fourth direction m, and a second spacing region 212c is arranged between adjacent second sawtooth portions 212a1. The plurality of second sawtooth portions 212a1 are arranged along the fourth direction m, and each of the second sawtooth portions 212a1 extends along the fifth direction n; an included angle between the second direction y and the fifth direction n ranges from 45° to 90°. FIG. 22 and FIG. 23 are described by taking the case where the angle between the second direction y and the fifth direction n is 90°, and the angle between the first direction x and the fourth direction m is 90° as an example.

For example, as illustrated by FIG. 22, the included angle between the second direction y and the fifth direction n is 90°, and the first direction x and the fourth direction m are parallel. In the first direction x and the fourth direction m, the adjacent first color conversion pattern 207a and second color conversion pattern 207b, the adjacent first color conversion pattern 207a and light transmitting pattern 207c, and the adjacent second color conversion patterns 207b and light transmitting patterns 207c are spaced apart by the first black matrixes 206, respectively; in the first direction x, the first black matrixes 206 are in one-to-one correspondence with the first spacing regions 211c, and, in the fourth direction m, the first black matrixes 206 and the second spacing regions 212c are in one-to-one correspondence.

For example, as illustrated by FIG. 22, on a plane where the first direction x and the third direction z are located, a cross-sectional shape of the first sawtooth portion 211al includes an equilateral triangle. In an example, the cross-sectional shape of the first sawtooth portion 211a1 may also be a right-angled isosceles triangle or a non-equilateral and non-right-angled triangle. In the first direction x, an edge length of a base edge of the equilateral triangle close to the first base substrate 201 is equal to or substantially equal to a size of a corresponding one of the first color conversion pattern 207a, the second color conversion pattern 207b and the light transmitting pattern 207c in a direction parallel to the base edge.

For example, as illustrated by FIG. 23, on a plane where the fourth direction m and the third direction z are located, a cross-sectional shape of the second sawtooth portion 212a1 includes an equilateral triangle, and in an example, the cross-sectional shape of the second sawtooth portion 212a1 can also be a right-angled isosceles triangle or a non-equilateral and non-right-angled triangle. In the fourth direction m, an edge length of a base edge of the equilateral triangle close to the first base substrate 201 is equal to or substantially equal to a size of a corresponding one of the first color conversion pattern 207a, the second color conversion pattern 207b and the light transmitting pattern 207c in a direction parallel to the base edge.

For example, as illustrated by FIG. 22, an orthographic projection of the first color conversion pattern 207a on the first base substrate 201 is coincided with an orthographic projection of the first sawtooth portion 211a1 corresponding to the first color conversion pattern 207a on the first base substrate 201. An orthographic projection of the second color conversion pattern 207b on the first base substrate 201 is coincided with an orthographic projection of the first sawtooth portion 211a1 corresponding to the second color conversion pattern 207b on the first base substrate 201. An orthographic projection of the first color conversion pattern 207a on the first base substrate 201 is coincided with an orthographic projection of the second sawtooth portion 212a1 corresponding to the first color conversion pattern 207a on the first base substrate 201, and an orthographic projection of the second color conversion pattern 207a on the first base substrate 201 is coincided with an orthographic projection of the second sawtooth portion 212a1 corresponding to the second color conversion pattern 207a on the first base substrate 201.

For example, in an example, a ratio of the number of the first sawtooth portions 211a1 to a sum of the number of the first color conversion patterns 207a and the number of the second color conversion patterns 207b is 1:1, that is, each of the first color conversion patterns 207a corresponds to one of the first sawtooth portions 211al, and each of the second color conversion patterns 207b also corresponds to one of the first sawtooth portions 211a1, and no first sawtooth portion 211a1 is provided at a position corresponding to the first black matrix 206 and at a position corresponding to the light transmitting pattern 207c. The ratio of the number of the second sawtooth portions 212a1 to the sum of the number of the first color conversion patterns 207a and the number of the second color conversion patterns 207b is 1:1, that is, each of the first color conversion patterns 207a corresponds to a second sawtooth portion 212a1, and each of the second color conversion patterns 207b also corresponds to a second sawtooth portion 212al, and no second sawtooth portion is provided at the position corresponding to the first black matrix 206 and at the position corresponding to the light transmitting pattern 207c.

For example, in another example, the ratio of the number of the first sawtooth portions 211a1 to the sum of the number of the first color conversion patterns 207a and the number of the second color conversion patterns 207b is 2:1, that is, each of the first color conversion patterns 207a corresponds to two first sawtooth portions 211al, and each of the second color conversion patterns 207b also corresponds to two first sawtooth portions 211a1, and no first sawtooth portion 211a1 is provided at the position corresponding to the first black matrix 206 and at the position corresponding to the light transmitting pattern 207c. The ratio of the number of the second sawtooth portions 212a1 to the sum of the number of the first color conversion patterns 207a and the number of the second color conversion patterns 207b is 2:1, that is, each of the first color conversion patterns 207a corresponds to two second sawtooth portions 212al, and each of the second color conversion patterns 207b also corresponds to two second sawtooth portions 212al, and no second sawtooth portion 212a1 is provided at the position corresponding to the first black matrix 206 and at the position corresponding to the light transmitting pattern 207c.

For example, the above-mentioned FIG. 15 to FIG. 23 are all described by taking the case that the first light extraction layer 211 is arranged at a side of the second light extraction layer 212 close to the first base substrate 201 as an example. In another example, the first light extraction layer 211 may be arranged at a side of the second light extraction layer 212 away from the first base substrate 201, which is not limited by the embodiment of the present disclosure.

Figure 24:
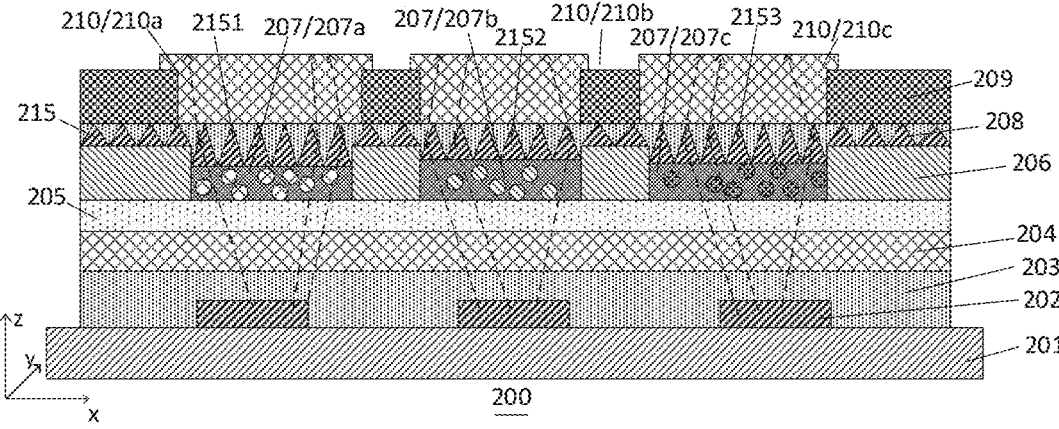
FIG. 24 is a schematic cross-sectional view of another display panel provided by an embodiment of the present disclosure.
Figure 25:
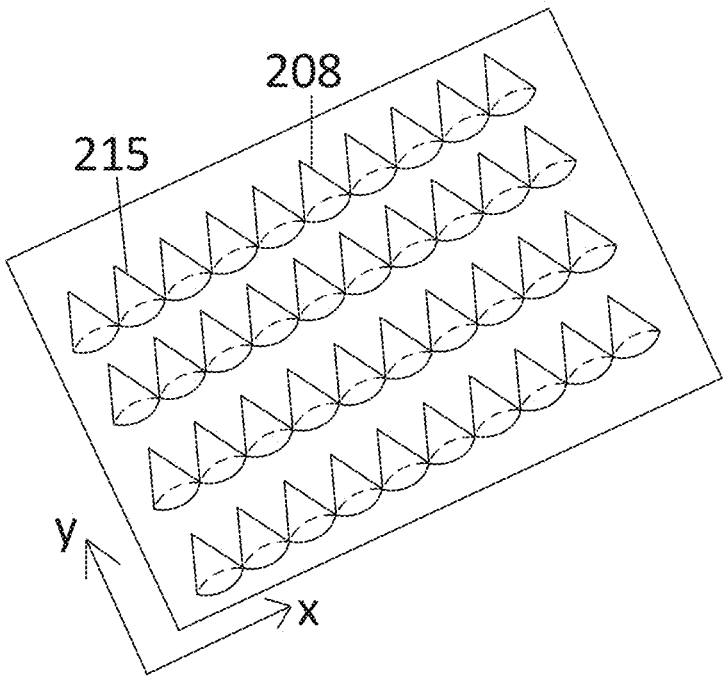
FIG. 25 is a schematic diagram of an arrangement structure of the light extraction layer shown in FIG. 24 on a plane where a first direction and a second direction are located.

For example, FIG. 24 is a schematic cross-sectional structure diagram of another display panel provided by an embodiment of the present disclosure, and FIG. 25 is a schematic three-dimensional structure diagram of the light extraction layer shown in FIG. 24. As illustrated by FIG. 24 and FIG. 25, the light extraction layer 208 includes a plurality of convex portions 215 arranged in a single layer, and the convex portions 215 are arranged in an array along a first direction x and a second direction y that cross each other. FIG. 24 and FIG. 25 are described by taking the case that the shape of the convex portion 215 is a cone as an example.

Figure 26:
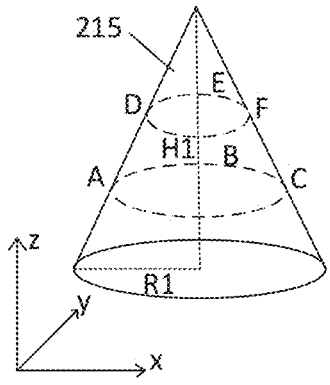
FIG. 26 is a schematic diagram of a three-dimensional structure of a convex portion provided by an embodiment of the present disclosure.

For example, FIG. 26 is a schematic diagram of a three-dimensional structure of a convex portion provided by an embodiment of the present disclosure. As illustrated by FIG. 26, the shape of the convex portion 215 is a cone, and a direction perpendicular to a main surface of the first base substrate 201 is a third direction z. From a position close to the first base substrate 201 to a position away from the first base substrate 201 along the third direction z, the areas of the cross-sections of the convex portion 215 on planes parallel to the main surface of the first base substrate 201 gradually decreases. For example, the first plane ABC is closer to the first base substrate 201 than the second plane DEF, and the area of the cross-section of the first plane ABC is larger than the area of the cross-section of the second plane DEF.

For example, as illustrated by FIG. 26, a ratio of a radius R1 of a bottom surface of the cone to a height H1 of the cone ranges from 0.5 to 1.0, for example, 0.5, 0.6, 0.7, 0.8, 0.9 or 1.0, and the radius R1 of a bottom surface of the cone ranges from 10 microns to 25 microns, for example, the radius R1 of the bottom surface of the cone is 10 microns, 15 microns, 20 microns or 25 microns.

For example, as illustrated by FIG. 24, shapes of the convex portions 215 are all cones, and a ratio of a radius of a bottom surface of a first cone corresponding to a first convex portion 2151 to a height of the first cone ranges from 0.5 to 1.0, and the radius of the bottom surface of the first cone ranges from 20 microns to 25 microns. A ratio of a radius of a bottom surface of a second cone corresponding to a second convex portion 2152 to a height of the second cone ranges from 0.5 to 1.0, and the radius of the bottom surface of the second cone ranges from 10 microns to 15 microns. A ratio of the radius of a bottom surface of a third cone corresponding to the third convex portion 2153 to a height of the third cone ranges from 0.5 to 1.0, and the radius of the bottom surface of the third cone ranges from 15 microns to 20 microns.

For example, as illustrated by FIG. 24, the convex portion 215 at a side of the first color conversion pattern 207a away from the first base substrate 201 is the first convex portion 2151, the convex portion 215 at a side of the second color conversion pattern 207b away from the first base substrate 201 is the second convex portion 2152, and the convex portion 215 at a side of the light transmitting pattern 207c away from the first base substrate 201 is the third convex portion 2153. The first color conversion pattern 207a is a red light conversion pattern, the second color conversion pattern 207b is a green light conversion pattern, and the light transmitting pattern 207c directly transmits blue light. The height of the first convex portion 2151 is greater than the height of the third convex portion 2153, and the height of the third convex portion 2153 is greater than the height of the second convex portion 2152. By arranging the first convex portion 2151, the second convex portion 2152 and the third convex portion 2153 in the above size relationship, the display panel can make the final light mixing effect better.

For example, in another example, the shape of the convex portion 215 may also include at least one of a triangular pyramid and a hemisphere. In the case that the shape of the convex portion 215 is a triangular pyramid or a hemisphere, the arrangement of the convex portion 215 can be seen from the above description related to the convex portion 215 with a cone shape, which is not limited by the embodiment of the present disclosure.

Figure 27:
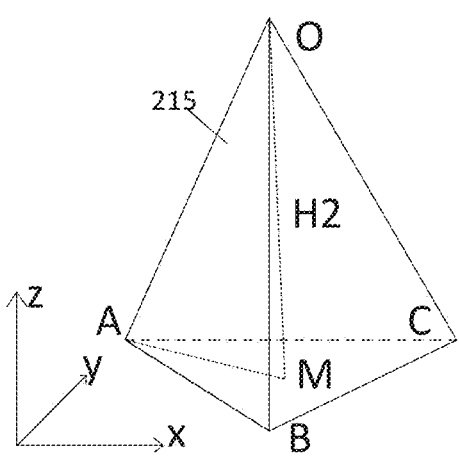
FIG. 27 is a schematic diagram of a three-dimensional structure of another convex portion provided by an embodiment of the present disclosure.

For example, FIG. 27 is a schematic diagram of a three-dimensional structure of another convex portion provided by an embodiment of the present disclosure. As illustrated by FIG. 27, the shape of the convex portion 215 includes a triangular pyramid whose bottom surface is an equilateral triangle ABC, and a ratio of a distance between a gravity center m of a bottom surface of the triangular pyramid and a vertex A of the bottom surface to a height H2 of the triangular pyramid ranges from 0.5 to 1.0, for example, 0.5, 0.7, 0.8, 0.9 or 1.0; and the distance AM between the gravity center M of the bottom surface of the triangular pyramid and the vertex A of the bottom surface ranges from 20 microns to 30 microns, for example, the length of AM is 20 microns, 25 microns or 30 microns.

Figure 28:
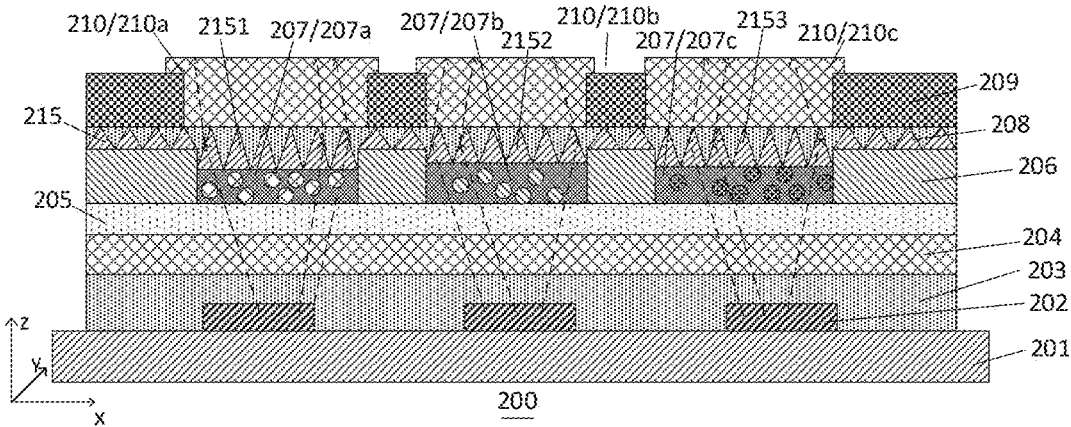
FIG. 28 is a schematic cross-sectional view of another display panel provided by an embodiment of the present disclosure.

For example, FIG. 28 is a schematic cross-sectional structure diagram of another display panel provided by an embodiment of the present disclosure. In combination to FIG. 27 and FIG. 28, in an example, the shapes of the convex portions 215 are all triangular pyramids, and the bottom surface of the triangular pyramid is an equilateral triangle. A ratio of a distance between a gravity center of a bottom surface of a first triangular pyramid corresponding to a first convex portion 2151 and a vertex of the bottom surface to a height of the first triangular pyramid ranges from 0.8 to 1.0, for example, 0.8, 0.9 or 1.0, and the distance between the gravity center of the bottom surface of the first triangular pyramid and the vertex of the bottom surface ranges from 25 microns to 30 microns, for example, 25 microns, 28 microns or 30 microns. A ratio of a distance between a gravity center of a bottom surface of a second triangular pyramid corresponding to a second convex portion 2152 and a vertex of the bottom surface to a height of the second triangular pyramid ranges from 0.5 to 0.8, for example, 0.5, 0.7 or 0.8, and the distance between the gravity center of the bottom surface of the second triangular pyramid and the vertex of the bottom surface ranges from 20 microns to 25 microns, for example, 20 microns, 22 microns or 25 microns. A ratio of a distance between a gravity center of a bottom surface of a third triangular pyramid corresponding to a third convex portion 2153 and a vertex of the bottom surface to a height of the third triangular pyramid ranges from 0.5 to 0.8, for example, 0.5, 0.7 or 0.8, and the distance between the gravity center of the bottom surface of the third triangular pyramid and the vertex of the bottom surface ranges from 20 microns to 25 microns, for example, 20 microns, 22 microns or 25 microns.

Figure 29:
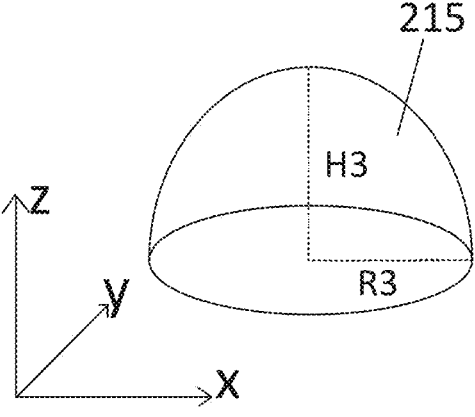
FIG. 29 is a schematic diagram of a three-dimensional structure of another convex portion provided by an embodiment of the present disclosure.

For example, FIG. 29 is a schematic diagram of a three-dimensional structure of another convex portion provided by an embodiment of the present disclosure. As illustrated by FIG. 29, the shape of the convex portion 215 includes a hemisphere, and a ratio of a radius R3 of a bottom surface of the hemisphere to a height H3 of the hemisphere ranges from 0.8 to 1.0, for example, 0.8, 0.9 or 1.0. For example, the radius R3 of the bottom surface of the hemisphere ranges from 10 microns to 25 microns, for example, the radius R3 of the bottom surface of the hemisphere is 10 microns, 15 microns, 20 microns or 25 microns.

Figure 30:
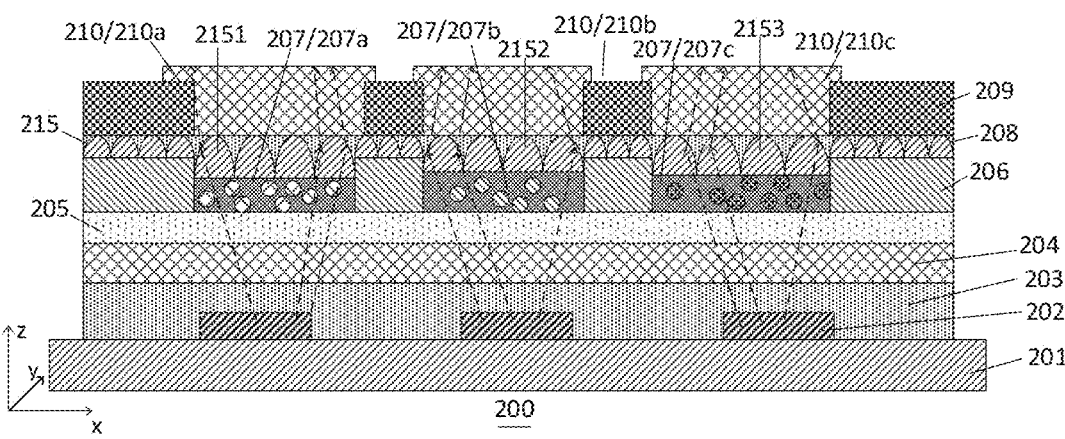
FIG. 30 is a schematic cross-sectional view of another display panel provided by an embodiment of the present disclosure.

For example, FIG. 30 is a schematic cross-sectional structure diagram of another display panel provided by an embodiment of the present disclosure. As illustrated by FIG. 30, the convex portion 215 at a side of the first color conversion pattern 207a away from the first base substrate 201 is the first convex portion 2151, and the convex portion 215 at a side of the second color conversion pattern 207b away from the first base substrate 201 is the second convex portion 2152, and the convex portion 215 at a side of the light transmitting pattern 207c away from the first base substrate 201 is the third convex portion 2153. The height of the first convex portion 2151 is greater than the height of the third convex portion 2153, and the height of the third convex portion 2153 is greater than the height of the second convex portion 2152. By arranging the first convex portion 2151, the second convex portion 2152 and the third convex portion 2153 in the above-mentioned size relationship, the display panel can make the final light mixing effect better.

For example, as illustrated by FIG. 30, shapes of the convex portions 215 are all hemispheres, and a ratio of a radius of a bottom surface of a first hemisphere corresponding to a first convex portion 2151 to a height of the first hemispherical ranges from 0.8 to 1.0, for example, 0.5, 0.7 or 0.8, and the radius of the bottom surface of the first hemisphere ranges from 20 microns to 25 microns, for example, 20 microns, 22 microns or 25 microns. A ratio of a radius of a bottom surface of a second hemisphere corresponding to the second convex portion 2152 to a height of the second hemisphere ranges from 0.8 to 1.0, for example, 0.8, 0.9 or 1.0, and the radius of the bottom surface of the second hemisphere ranges from 10 microns to 15 microns. A ratio of a radius of a bottom surface of a third hemisphere corresponding to the third convex portion 2153 to a height of the third hemisphere ranges from 0.8 to 1.0, for example, 0.8, 0.9 or 1.0, and the radius of the bottom surface of the third hemisphere ranges from 15 microns to 20 microns, for example, 20 microns, 22 microns or 25 microns.

Figure 31:
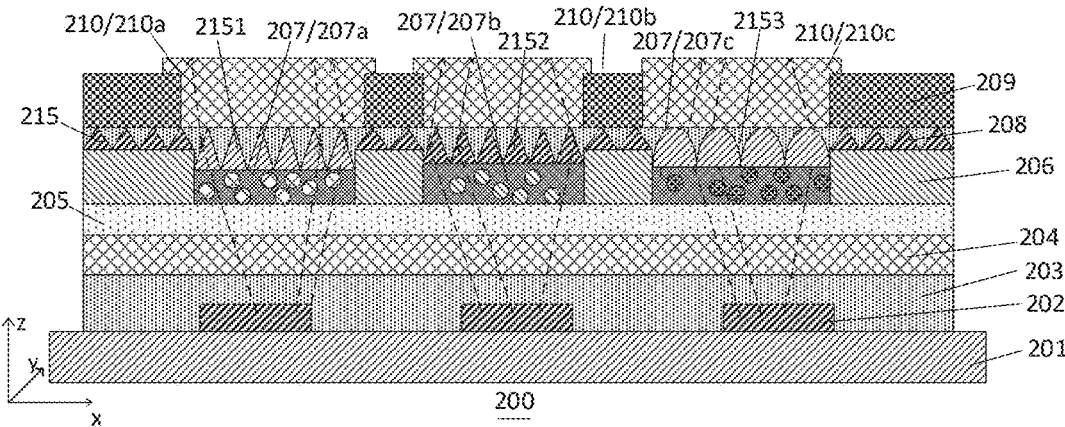
FIG. 31 is a schematic cross-sectional view of another display panel provided by an embodiment of the present disclosure.

For example, FIG. 31 is a schematic cross-sectional structure diagram of another display panel provided by an embodiment of the present disclosure. As illustrated by FIG. 31, the convex portion 215 at a side of the first color conversion pattern 207a away from the first base substrate 201 is the first convex portion 2151, the convex portion 215 at a side of the second color conversion pattern 207b away from the first base substrate 201 is the second convex portion 2152, and the convex portion 215 at a side of the light transmitting pattern 207c away from the first base substrate 201 is the third convex portion 2153. The first convex portion 2151, the second convex portion 2152 and the third convex portion 2153 have different shapes. For example, the shape of the first convex portion 2151 is a triangular pyramid, the shape of the second convex portion 2152 is a cone and the shape of the third convex portion 2153 is a hemisphere. The embodiment of the present disclosure is not limited thereto, but the shape of the first convex portion 2151 may be a cone, the shape of the second convex portion may be a cone, and the shape of the third convex portion may be a hemisphere, or the shape of the first convex portion 2151 is hemisphere, the shape of the second convex portion 2152 is a triangular pyramid and the shape of the third convex portion 2153 is a cone, or the shape of the first convex portion 2151 is a cone, the shape of the second convex portion 2152 is a hemisphere and the shape of the third convex portion 2153 is a triangular pyramid, and all of the abovementioned cases satisfy that the height of the first convex portion 2151 is greater than the height of the third convex portion 2153, and the height of the third convex portion 2153 is greater than the height of the second convex portion 2152. In the cases that the shapes of the first convex portion 2151, the second convex portion 2152 and the third convex portion 2153 are all different, the light mixing effect of the emitted light can be better.

Figure 32:
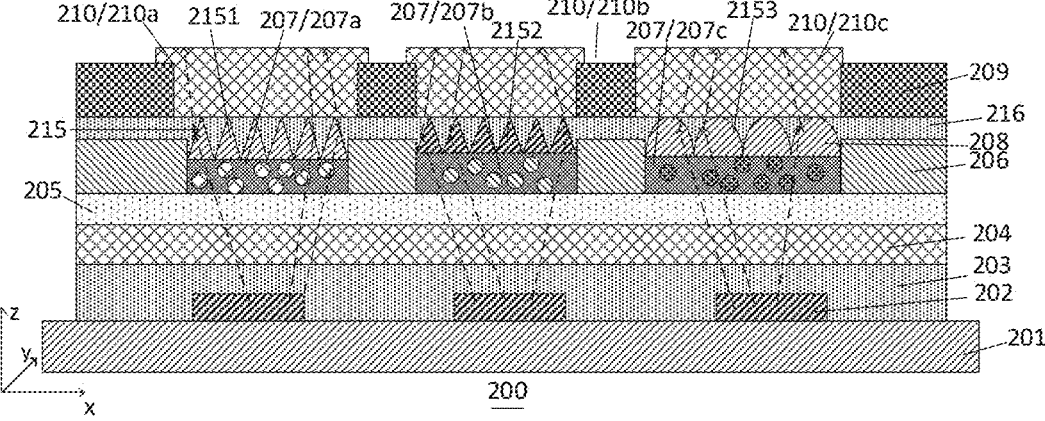
FIG. 32 is a schematic cross-sectional view of another display panel provided by an embodiment of the present disclosure.

For example, FIG. 32 is a schematic cross-sectional structure diagram of another display panel provided by an embodiment of the present disclosure. As illustrated by FIG. 32, the first color conversion pattern 207a and the second color conversion pattern 207b, the second color conversion pattern 207b and the light transmitting pattern 207c, and the first color conversion pattern 207a and the light transmitting pattern 207c are all separated by the first black matrixes 206, and the first black matrixes 206 and the third spacing regions 216 are in one-to-one correspondence, and at least two adjacent convex portions 215 may be adjacent convex portions 215 composed of the convex portion 215 corresponding to the first color conversion pattern 207a and the convex portions 215 corresponding to the second color conversion pattern 207b. The at least two adjacent convex portions 215 may also may be adjacent convex portions 215 composed of the convex portion 215 corresponding to the second color conversion pattern 207b and the convex portion 215 corresponding to the light transmitting pattern 207c. The at least two adjacent convex portions 215 may also be adjacent convex portions 215 composed of the convex portions 215 corresponding to the first color conversion pattern 207a and the convex portions 215 corresponding to the light transmitting pattern 207c.

For example, the case that the at least two adjacent convex portions 215 are provided with the third spacing region 216 therebetween may be that two adjacent convex protrusions in multiple convex protrusions corresponding to the first color conversion pattern 207a are provided with the third spacing region 216 therebetween, or two adjacent convex protrusions in multiple convex protrusions corresponding to the second color conversion pattern 207b are provided with the third spacing region 216 therebetween, or two adjacent convex protrusions in multiple convex protrusions corresponding to the light transmitting pattern 207c are provided with the third spacing region 216 therebetween. In the above cases, the third spacing regions 216 are not in correspondence with the first black matrixes 206.

For example, as illustrated by FIG. 32, each first color conversion pattern 207a corresponds to five first convex portions 2151, each second color conversion pattern 207b corresponds to six second convex portions 2152, and each light transmitting pattern 207c corresponds to four third convex portions 2153, a direction perpendicular to a main surface of the first base substrate 201 is a third direction z, and the shape of a cross-section of the convex portions 215 on a plane formed by the first direction x and the third direction z includes at least one of a triangle and an arch. For example, the cross-sectional shapes of each first convex portion 2151 and each second convex portion 2152 are triangles and the cross-sectional shape of each third convex portion 2153 is an arch.

For example, in another example, each first color conversion pattern 207a corresponds to one first convex portion 2151, each second color conversion pattern 207b corresponds to one second convex portion 2152, and each light transmitting pattern 207c corresponds to one third convex portion 2153. A direction perpendicular to a main surface of the first base substrate 201 is a third direction z, and the shape of a cross-section of the convex portions 215 on a plane formed by the first direction x and the third direction z includes at least one of a triangle and an arch. For example, the cross-sectional shapes of the first convex portion 2151 and the second convex portion 2152 are both triangular, and the cross-sectional shape of the third convex portion 2153 is an arch, an edge length of a base edge of the triangle or the arch close to the first base substrate 201 is equal to or substantially equal to a size of a corresponding one of the first color conversion pattern 207a, the second color conversion pattern 207b or the light transmitting pattern 207c in a direction parallel to the base edge. That is, a ratio of the number of the convex portions 215 to a sum of the number of the first color conversion pattern 207a, the number of the second color conversion pattern 207b and the number of the light transmitting pattern 207c is 1:1.

Of course, the embodiment of the present disclosure is not limited thereto, and the ratio of the number of the convex portions 215 to the sum of the number of the first color conversion pattern 207a, the number of the second color conversion pattern 207b and the number of the light transmitting pattern 207c may be 2:1. For example, each first color conversion pattern 207a corresponds to two first convex portions 2151, each second color conversion pattern 207b corresponds to two second convex portions 2152, and each light transmitting pattern 207c corresponds to two third convex portions 2153. The ratio of the number of the convex portions 215 to the sum of the number of the first color conversion pattern 207a, the number of the second color conversion pattern 207b and the number of the light transmitting pattern 207c may also be n:1, where n is a positive integer greater than or equal to 1.

For example, as illustrated by FIG. 24, FIG. 28, FIG. 30, FIG. 31 and FIG. 32, the first color conversion pattern 207a is a red light conversion pattern, the second color conversion pattern 207b is a green light conversion pattern, and the light transmitting pattern 207c directly transmits blue light. In the third direction z, a thickness of the first convex portion 2151 is greater than a thickness of the second convex portion 2152. This arrangement can make the final light mixing effect better.

Figure 33:
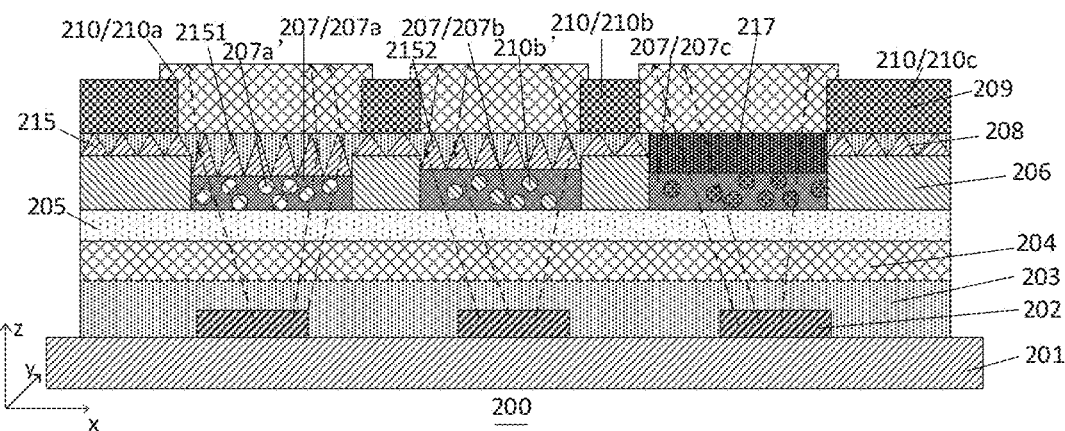
FIG. 33 is a schematic cross-sectional view of another display panel provided by an embodiment of the present disclosure.

For example, FIG. 33 is a schematic cross-sectional view of another display panel provided by an embodiment of the present disclosure, as illustrated by FIG. 33, the color conversion layer 207 includes a flat portion 217, a first color conversion pattern 207a and a second color conversion pattern 207b, and the first color conversion pattern 207a includes first color conversion particles 207a' and the second color conversion pattern 207b includes second color conversion particles 207b'. The first color conversion particles 207a' are configured to convert light of a first color into light of a second color, the second color conversion particles 207b' are configured to convert light of a first color into light of a third color, and the flat portion 217 is configured to directly transmit light of the first color entering the flat portion 217, and scattering particles are not included in the flat portion 217, but only to cushion the color film layer 210 so that the surface of the color film layer 210 becomes flat.

For example, in an example, the first color conversion particles 207a' include first quantum dots and the second color conversion particles 207b' include second quantum dots, the first quantum dots are configured to convert light of a first color into light of a second color, and the second quantum dots are configured to convert light of the first color into light of a third color.

For example, in an example, the light of the first color is blue light, the first color conversion particles 207a' include red quantum dots, and the second color conversion particles 207b' include green quantum dots, the red quantum dots are configured to convert the light of the first color into light of the second color, and the light of the second color is red light. The green quantum dots are configured to convert light of a first color into light of a third color, and the light of the third color is green light.

For example, in an example, the light extraction layer 208 includes a plurality of convex portions 215, as illustrated by FIG. 33, the plurality of convex portions 215 are arranged in an array along a first direction x and a second direction y that cross each other, and the shapes of the convex portions 215 include at least one of a triangular pyramid, a cone and a hemisphere. FIG. 33 is described by taking the case that the shape of the convex portion 215 is a triangular pyramid as an example, and the case that a ratio of the number of convex portions 215 to a sum of the number of the first color conversion pattern 207a and the number of the second color conversion pattern 207b is 6:1 is shown as an example. Of course, the embodiment of the present disclosure is not limited thereto, and the ratio of the number of convex portions 215 to the sum of the number of the first color conversion patterns 207a and the number of the second color conversion pattern 207b may be 1:1 or 2, and the embodiment of the present disclosure is not limited thereto.

For example, as illustrated by FIG. 33, the convex portions 215 at a side of the first color conversion pattern 207a away from the first base substrate 201 are the first convex portions 2151, and the convex portions 215 at a side of the second color conversion pattern 207b away from the first base substrate 201 are the second convex portions 2152. The direction perpendicular to the main surface of the first base substrate 201 is the third direction z; along the third direction z, a thickness of each of the first convex portions is greater than a thickness of each of the second convex portions 2151.

For example, as illustrated by FIG. 33, shapes of the convex portions 215 are all triangular pyramids, and the three-dimensional structure of the triangular pyramid can be seen in FIG. 27. In combination to FIG. 27 and FIG. 33, a bottom surface of the triangular pyramid is an equilateral triangle, and a ratio of a distance AM between a gravity center M of a bottom surface of a first triangular pyramid corresponding to the first convex portion 2151 and a vertex A of the bottom surface to a height H2 of the first triangular pyramid ranges from 0.8 to 1.0, and the distance AM between the gravity center M of the bottom surface of the first triangular pyramid and the vertex A of the bottom surface ranges from 25 microns to 30 microns. A ratio of a distance AM between a gravity center m of a bottom surface of a second triangular pyramid corresponding to the second convex portion 2152 and a vertex of the bottom surface to a height H2 of the second triangular pyramid ranges from 0.5 to 0.8, and the distance between the gravity center M of the bottom surface of the second triangular pyramid to the vertex O of the bottom surface ranges from 20 microns to 25 microns.

Figure 34:
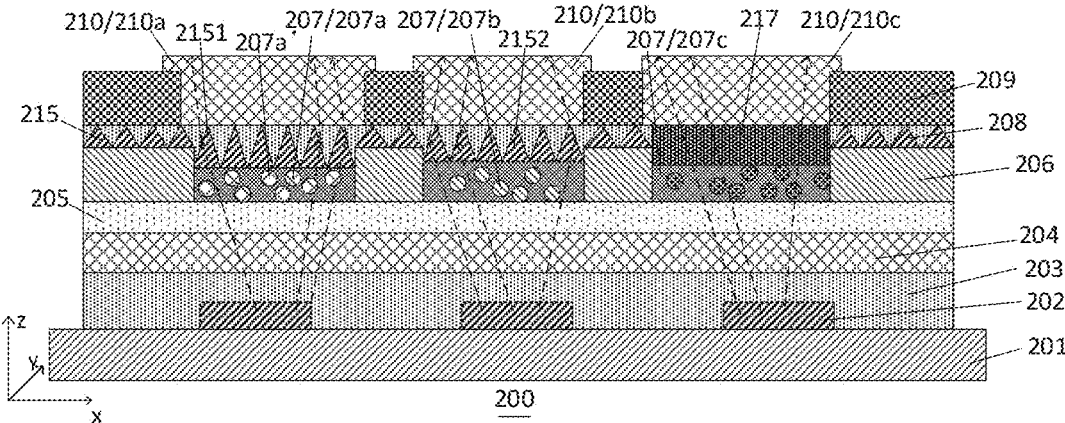
FIG. 34 is a schematic cross-sectional view of another display panel provided by an embodiment of the present disclosure.

For example, FIG. 34 is a schematic cross-sectional structure diagram of another display panel provided by an embodiment of the present disclosure. As illustrated by FIG. 34, the shapes of the convex portions 215 are all cones, and the three-dimensional structure of the cone can be seen in FIG. 26. In combination to FIG. 26 and FIG. 34, a ratio of a radius R1 of a bottom surface of a first cone corresponding to the first convex structure 2151 to a height H1 of the first cone ranges from 0.5 to 1.0, and the radius R1 of the first conical bottom surface ranges from 20 microns to 25 microns. A ratio of a radius R1 of a bottom surface of a second cone corresponding to the second convex portion 2152 to a height H1 of the second cone ranges from 0.5 to 1.0, and the radius R1 of the bottom surface of the second cone ranges from 10 microns to 15 microns.

Figure 35:
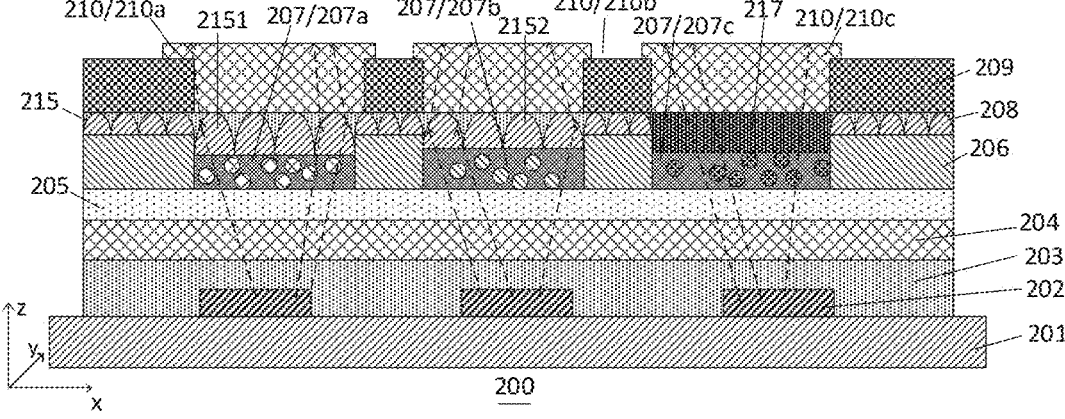
FIG. 35 is a schematic cross-sectional view of another display panel provided by an embodiment of the present disclosure.

For example, FIG. 35 is a schematic diagram of a cross-sectional structure of another display panel provided by an embodiment of the present disclosure. As illustrated by FIG. 35, the shapes of the convex portions 215 are all hemispheres, and the three-dimensional structure of the hemisphere can be seen in FIG. 29. In combination to FIG. 29 and FIG. 35, a ratio of a radius R3 of a bottom surface of a first hemisphere corresponding to the first convex portion 2151 to a height H3 of the first hemisphere ranges from 0.8 to 1.0, and the radius R3 of the bottom surface of the first hemisphere ranges from 20 microns to 25 microns. A ratio of a radius of a bottom surface of a second hemisphere corresponding to the second convex portion 2152 to a height H3 of the second hemisphere ranges from 0.8 to 1.0, and the radius R3 of the bottom surface of the second hemisphere ranges from 10 microns to 15 microns.

It should be noted that, the height, the radius of the bottom surface or the distance from the gravity center of the bottom surface to the vertex of the bottom surface of two convex portions 215 with the same shape may be the same or different, which is not limited by the embodiment of the present disclosure.

Figure 36:
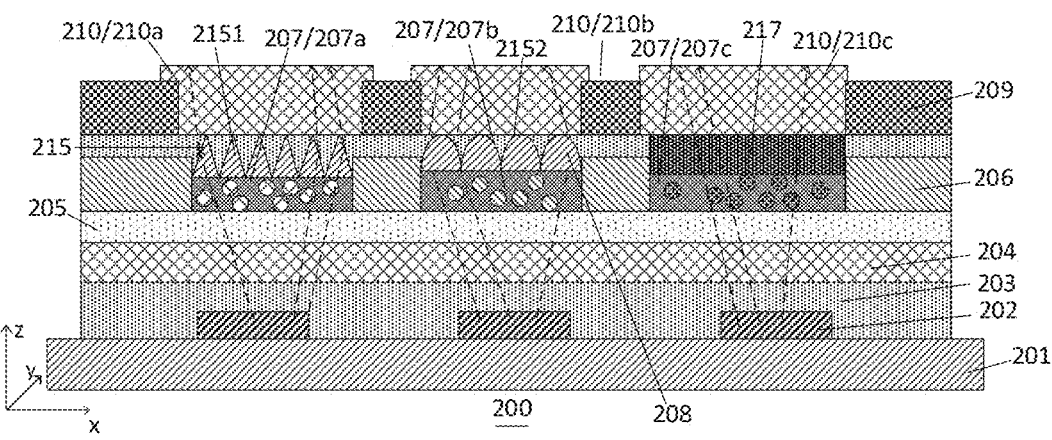
FIG. 36 is a schematic cross-sectional view of another display panel provided by an embodiment of the present disclosure.

For example, in another example, the shape of the first convex portion 2151 is one of a cone, a hemisphere and a triangular pyramid, and the shape of the second convex portion 2152 is another one of the cone, the hemisphere and the triangular pyramid, that is, as long as the shape of the first convex portion 2151 and the shape of the second convex portion 2152 are different, for example, FIG. 36 is a schematic cross-sectional structure diagram of another display panel provided by an embodiment of the present disclosure. The shape of the first convex portion 2151 is a cone and the shape of the second convex portion 2152 is a hemisphere, but the embodiment of the present disclosure is not limited thereto, and the shape of the first convex portion 2151 may be a hemisphere and the shape of the second convex portion 2152 may be a cone. Alternatively, the shape of the first convex portion 2151 is a hemisphere, and the shape of the second convex portion 2152 is a triangular pyramid. Alternatively, the shape of the first convex portion 2151 is a triangular pyramid, and the shape of the second convex portion 2152 is a hemisphere. Alternatively, the shape of the first convex structure 2151 is a triangular pyramid, and the shape of the second convex portion 2152 is a cone. Alternatively, the shape of the first convex portion 2151 is a cone, and the shape of the second convex portion 2152 is a triangular pyramid.

For example, in an example, the material of the light extraction layer 208 includes at least one of acrylic resin, polyurethane resin, silicone resin and epoxy resin, and the refractive index of the light extraction layer 208 ranges from 1.4 to 1.65, for example, 1.4, 1.5, 1.6 or 1.65.

Figure 37:
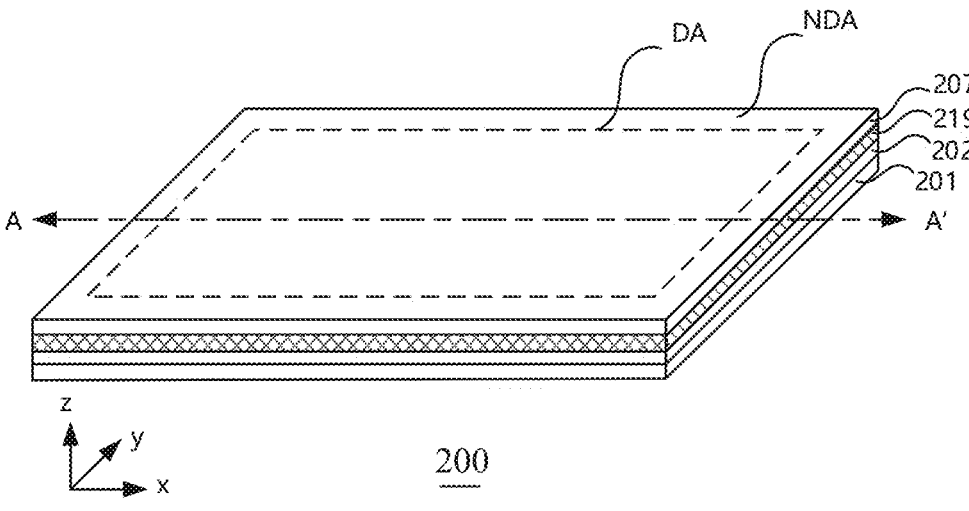
FIG. 37 is a schematic diagram of a three-dimensional structure of a display panel according to an embodiment of the present disclosure.
Figure 38:
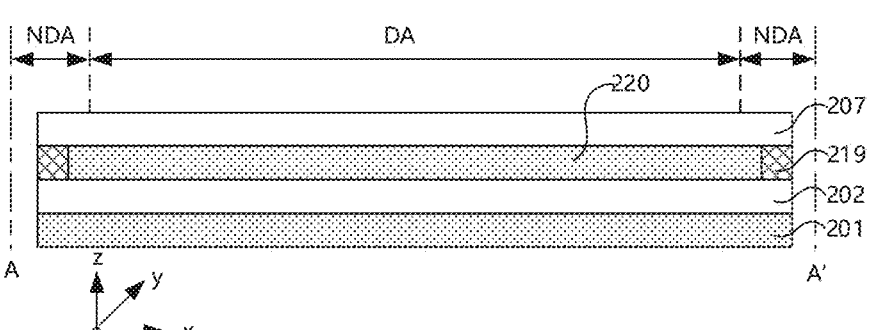
FIG. 38 is a schematic cross-sectional view of the display panel according to the embodiment shown in FIG. 37 along line A-A'.

For example, FIG. 37 is a schematic view of a three dimensional structure of a display panel provided by an embodiment of the present disclosure, and FIG. 38 is a schematic cross-sectional view of the display panel along line A-A' according to the embodiment shown in FIG. 37. As illustrated by FIG. 37 and FIG. 38, the display panel 200 includes a light emitting element layer 202 and a color conversion layer 207. The display panel 200 includes a display region DA for displaying images and a non-display region NDA for not displaying images, and the non-display region NDA surrounds the outside of the display region DA. In some examples, the non-display region NDA may enclose the display region DA and may be located outside the display region DA in at least one direction. The display panel 200 further includes a sealing layer 219 for sealing the light emitting element layer 202 and the color conversion layer 207, and a filling layer 220 filled between the light emitting element layer 202 and the color conversion layer 207.

The display panel 200 may have a rectangular shape in the plan view, and may also have a circular shape, an oval shape, a diamond shape, a trapezoid shape, a square shape or other shapes according to display requirements. The display panel 200 may include two first edges extending in a first direction x and two second edges extending in a second direction y crossing the first direction x. Unless otherwise defined, the terms "above", "upper side", "upper portion", "top portion" and "top surface" as used herein refer to directions indicated by arrows in a third direction z intersecting the first direction x and the second direction y, and the terms "under", "lower side", "lower portion", "bottom" and "bottom surface" as used herein refer to a direction opposite to the arrows in a third direction z.

For example, as illustrated by FIG. 37 and FIG. 38, the light emitting element layer 202 and the color conversion layer 207 may be arranged opposite to each other. The color conversion layer 207 may include a color conversion pattern for converting the color of incident light. The color conversion pattern may include at least one of a color filter and a wavelength conversion pattern, and the specific setting of the color conversion pattern can be referred to the relevant descriptions in the above embodiments, and the repeated portions are omitted herein.

For example, the sealing layer 219 may be located between the light emitting element layer 202 and the color conversion layer 207 and in the non-display region NDA. The sealing layer 219 may be arranged along the edges of the light emitting element layer 202 and the color conversion layer 207 in the non-display region NDA so as to surround the periphery of the display region DA or around the periphery of the display region DA in the plan view. The sealing layer 219 may be made of an organic material, for example, the sealing layer 219 may be made of an epoxy-based resin, and the embodiments of the present disclosure are not limited thereto.

For example, the filling layer 220 may be filled in a space between the light emitting element layer 202 and the color conversion layer 207 and surrounded by the sealing layer 219. The filling layer 220 may be made of a material capable of transmitting light. The filling layer 220 may be made of an organic material, for example, a silicon-based organic material or an epoxy-based organic material, but the embodiments of the present disclosure are not limited thereto. In some embodiments, the filler layer 220 may also be omitted.

Figure 39:
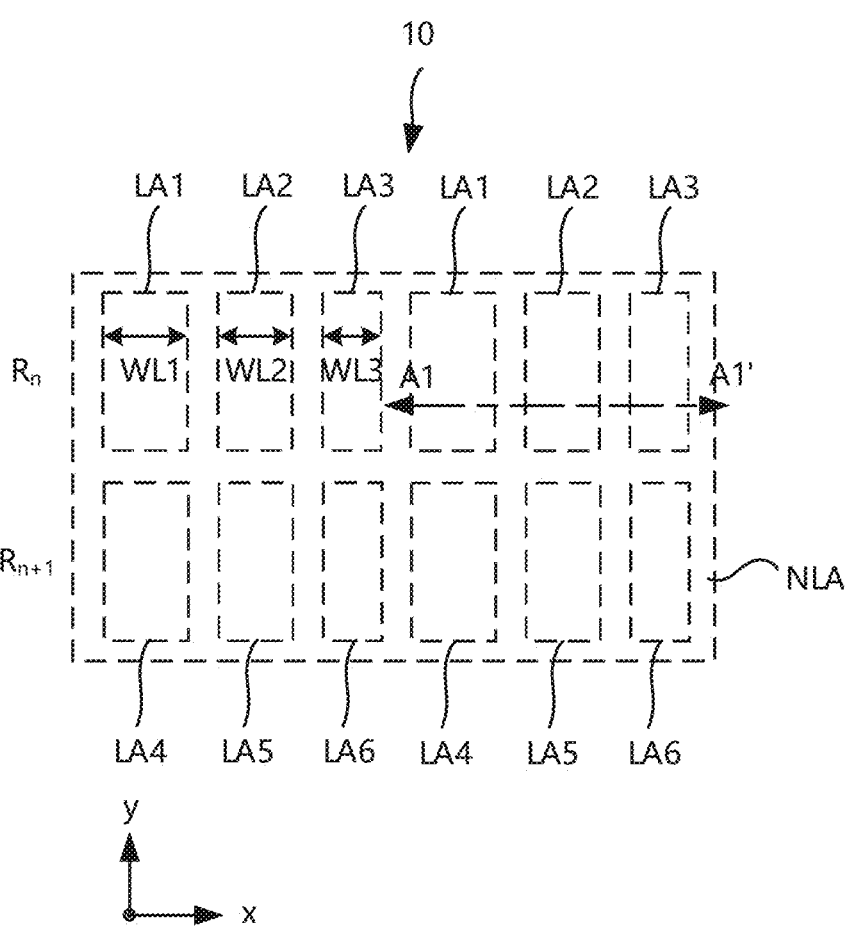
FIG. 39 is a plan view of a light emitting element layer in a display region of the display panel illustrated in FIG. 37 and FIG. 38.

For example, FIG. 39 shows a plan view of a light emitting element layer in the display region of the display panel illustrated in FIG. 37 and FIG. 38. As illustrated by FIG. 39, light emitting regions LA1, LA2, LA3, LA4, LA5 and LA6 and non-light emitting regions NLA may be defined in the display region DA of the light emitting element layer 202. The light emitted from the light emitting regions LA1, LA2, LA3, LA4, LA5 and LA6 to the outside of the light emitting element layer 202 may be emitted light L having a specific central wavelength band. For example, the emitted light L may be blue light and may have a peak wavelength in the range of about 440 nm to about 480 nm.

For example, the light emitting element layer 202 may include light emitting regions LA1, LA2, and LA3 arranged in the n-th row Rn in the display region DA, and light emitting regions LA4, LA5, and LA6 arranged in the adjacent (n+1)-th row Rn+1. In the light emitting element layer 202, in the n-th row Rn, the first light emitting region LA1, the second light emitting region LA2 and the third light emitting region LA3 may be sequentially and repeatedly arranged along the first direction x; in the (n+1)-th row Rn+1, the fourth light emitting region LA4, the fifth light emitting region LA5 and the sixth light emitting region LA6 may be sequentially and repeatedly arranged along the first direction x.

In a repeated light emitting region unit, in the n-th row Rn, along the first direction x, the first light emitting region LA1 has a first width WL1, the second light emitting region LA2 has a second width WL2, and the third light emitting region LA3 has a third width WL3, the first width WL1, the second width WL2, and the third width WL3 may be the same or different from each other. Embodiments of the present disclosure are not limited thereto.

In an exemplary embodiment, the first width WL1 of the first light emitting region LA1 may be greater than the second width WL2 of the second light emitting region LA2 and the third width WL3 of the third light emitting region LA3. Alternatively, for example, the second width WL2 of the second light emitting region LA2 may be greater than the third width WL3 of the third light emitting region LA3. Therefore, the area of the first light emitting region LA1 may be larger than the area of the second light emitting region LA2 and the area of the third light emitting region LA3, and the area of the second light emitting region LA2 may be larger than the area of the third light emitting region LA3.

For example, in an exemplary embodiment, the first width WL1 of the first light emitting region LA1, the second width WL2 of the second light emitting region LA2, and the third width WL3 of the third light emitting region LA3 may be substantially the same. Therefore, the area of the first light emitting region LA1, the area of the second light emitting region LA2 and the area of the third light emitting region LA3 may be substantially the same.

Similarly, in a repeated light emitting region unit, in the adjacent (n+1)-th row Rn+1, the fourth light emitting region LA4, the fifth light emitting region LA5 and the sixth light emitting region LA6 may have basically the same structure as the first light emitting region LA1, the second light emitting region LA2 and the third light emitting region LA3 of the n-th row Rn.

Figure 40:
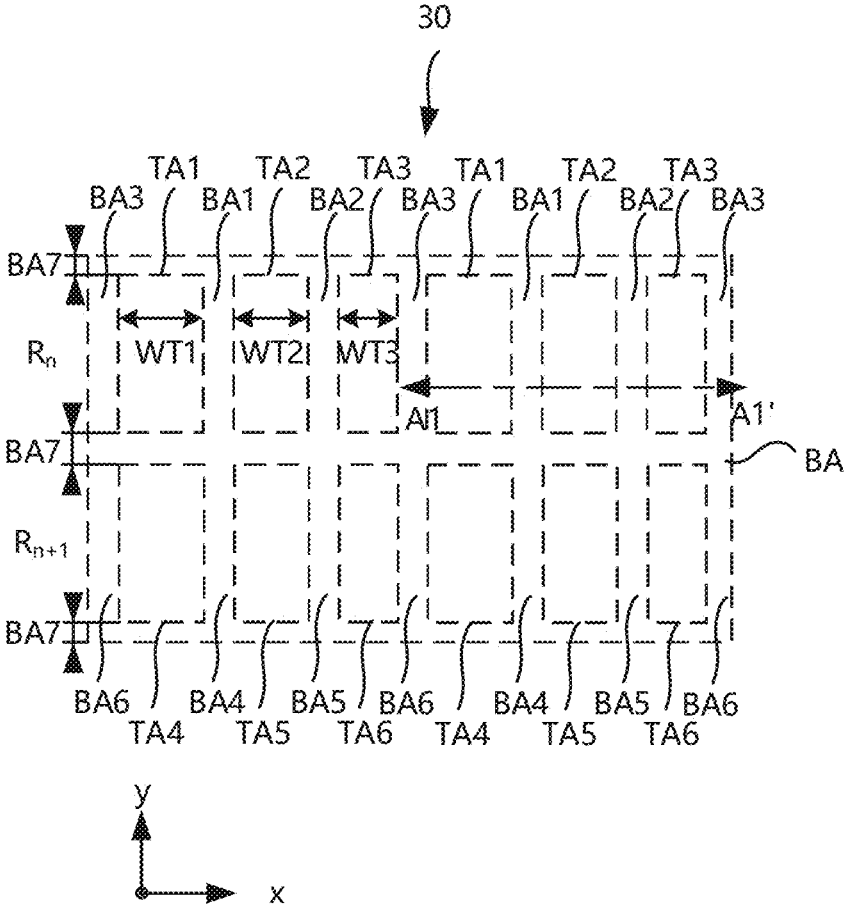
FIG. 40 is a schematic diagram of a plane structure of a color conversion layer of a display panel in a display region according to an embodiment of the present disclosure.

For example, FIG. 40 is a schematic plan view of the color conversion layer in the display region of the display panel provided by an embodiment of the present disclosure. As illustrated by FIG. 40, light transmitting regions TA1, TA2, TA3, TA4, TA5 and TA6 and light-blocking regions BA can be defined in the display region DA of the color conversion layer 207. In the light transmitting regions TA1, TA2, TA3, TA4, TA5 and TA6, light emitted from the light emitting element layer 202 may pass through the color conversion layer 207 and may be provided to the outside of the display device including the display panel. In the light blocking area BA, light emitted from the display substrate 10 may not be transmitted to the outside of the display device including the display panel.

For example, as illustrated by FIG. 40, the color conversion layer 207 may include light transmitting regions TA1, TA2 and TA3 arranged in the n-th row Rn in the display region DA, and light transmitting regions TA4, TA5 and TA6 arranged in the adjacent (n+1)-th row Rn+1. In the color conversion layer 207, in the n-th row Rn, the first light transmitting region TA1, the second light transmitting region TA2 and the third light transmitting region TA3 may be sequentially and repeatedly arranged along the first direction x; in the (n+1)-th row Rn+1, the fourth light transmitting region TA4, the fifth light transmitting region TA5 and the sixth light transmitting region TA6 may be sequentially and repeatedly arranged along the first direction x.

Figure 41:
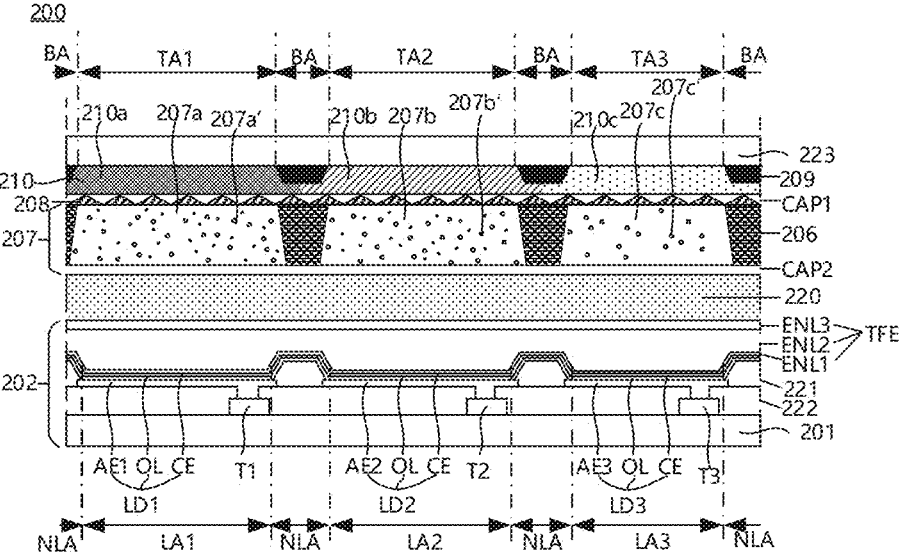
FIG. 41 is a schematic cross-sectional view of a display panel according to an embodiment of the present disclosure.

For example, FIG. 41 is a schematic cross-sectional structure diagram of a display panel provided by an embodiment of the present disclosure. As illustrated by FIG. 41, the first light transmitting region TA1 may correspond to and overlap with or face the first light emitting region LA1. Similarly, the second light transmitting region TA2 may correspond to and overlap with or face the second light emitting region LA2, and the third light transmitting region TA3 may correspond to and overlap with or face the third light emitting region LA3. Although only the first light transmitting region TA1, the second light transmitting region TA2 and the third light transmitting region TA3 are shown in FIG. 41, the fourth light transmitting region TA4, the fifth light transmitting region TA5 and the sixth light transmitting region TA6 are not shown. In combination to FIG. 40 and FIG. 41, similarly, the fourth light transmitting region TA4, the fifth light transmitting region TA5 and the sixth light transmitting region TA6 may overlap with or face the fourth light region LA4, the fifth light emitting region LA5 and the sixth light emitting region LA6, respectively.

For example, as illustrated by FIG. 41, the emitted light provided from the light emitting element layer 202 may be provided to the outside of the display panel 200 after passing through the first light transmitting region TA1, the second light transmitting region TA2 and the third light transmitting region TA3. The light emitted from the first light transmitting region TA1 to the outside of the display panel 200 may be referred to the first outgoing light. The light emitted from the second light transmitting region TA2 to the outside of the display panel 200 may be referred to the second outgoing light. The light emitted from the third light transmitting region TA3 to the outside of the display panel 200 may be referred to as the third outgoing light. The first outgoing light may be light of a first color, the second outgoing light may be light of a second color different from the first color, and the third outgoing light may be light of a third color different from the first color and the second color. As described above, the light of the first color may be red light having a peak wavelength in the range of about 610 nm to about 650 nm, and the light of the second color may be green light having a peak wavelength in the range of about 510 nm to about 550 nm. The light of the third color may be blue light having a peak wavelength in the range of about 440 nm to about 480 nm.

For example, as illustrated by FIG. 41, in a repeated light transmitting region unit, in the n-th row Rn, along the first direction x, the first light transmitting region TA1 may have a first width WT1, the second light transmitting region TA2 may have a second width WT2, and the third light transmitting region TA3 may have a third width WT3. The first width WT1 of the first light transmitting region TA1, the second width WT2 of the second light transmitting region TA2 and the third width WT3 of the third light transmitting region TA3 may be the same or different from each other. Embodiments of the present disclosure are not limited thereto.

For example, in an example, the first width WT1 of the first light transmitting region TA1 may be greater than the second width WT2 of the second light transmitting region TA2 and the third width WT3 of the third light transmitting region TA3. Alternatively, for example, the second width WT2 of the second light transmitting region TA2 may be greater than the third width WT3 of the third light transmitting region TA3. Therefore, the area of the first light transmitting region TA1 may be larger than the area of the second light transmitting region TA2 and the area of the third light transmitting region TA3, and the area of the second light transmitting region TA2 may be larger than the area of the third light transmitting region TA3. In an exemplary embodiment, the first width WT1 of the first light transmitting region TA1, the second width WT2 of the second light transmitting region TA2 and the third width WT3 of the third light transmitting region TA3 may be substantially the same. Therefore, the area of the first light transmitting region TA1, the area of the second light transmitting region TA2 and the area of the third light transmitting region TA3 may be basically the same.

For example, as illustrated by FIG. 41, a region corresponding to the first color conversion pattern 207a included in the plurality of color conversion patterns 207 is the first light transmitting region TA1, a region corresponding to the second color conversion pattern 207b included in the plurality of color conversion patterns 207 is the second light transmitting region TA2 and a region corresponding to the light transmitting pattern 207c included in the plurality of color conversion patterns 207 is the third light transmitting region TA3. In the light emitting element layer 202, a region corresponding to a first light emitting element LD1 is the first light emitting region LA1, a region corresponding to a second light emitting element LD2 is the second light emitting region LA2, and a region corresponding to a third light emitting element LD3 is the third light emitting region LA3. For example, the area of the first light transmitting region TA1 is larger than the area of the first light emitting region LA1, the area of the second light transmitting region TA2 is larger than the area of the second light emitting region LA2, and the area of the third light transmitting region TA3 is larger than the area of the third light emitting region LA3.

For example, in an example, a ratio of the area of the first light transmitting region TA1 to the area of the first light emitting region LA1 ranges from 100% to 120%, for example, the area of the first light transmitting region TA1 is 1.1 times or 1.2 times that of the first light emitting region LA1. A ratio of the area of the second light transmitting region TA2 to the area of the second light emitting region LA2 ranges from 100% to 120%, for example, the area of the second light transmitting region TA2 is 1.1 times or 1.2 times that of the second light emitting region LA2. A ratio of the area of the third light transmitting region TA3 to the area of the third light emitting region LA3 is 100%-120%, for example, the area of the third light transmitting region TA3 is 1.1 times or 1.2 times that of the third light emitting region LA3.

For example, the cross-sectional shape of a light emitting element needs to be consistent with that of a color conversion pattern or a light transmitting pattern, and its specific shape can be rectangular, rhombic or circular. In the case that the cross-sectional shape of the light emitting element is rectangular, a centroid of the cross-sectional shape of the light emitting element and a centroid of the corresponding color conversion pattern or a centroid of the corresponding light transmitting pattern are at the same position, and a length-width ratio of a cross-sectional shape of the light emitting element is consistent with a length-width ratio of the corresponding color conversion pattern or a length-width ratio of the corresponding light transmitting pattern, and its length and width increase proportionally with the area. In the case that the cross-sectional shape of the light emitting element is rhombic, the centroid of the cross-sectional shape of the light emitting element and the centroid of the cross-sectional shape of the corresponding color conversion pattern or light transmitting pattern are at the same position, and a length-width ratio of a diagonal of the cross-sectional shape of the light emitting element is in consistent with a length-width ratio of a diagonal of the cross-sectional shape of the corresponding color conversion pattern or light transmitting pattern, and its ratio increases proportionally with the area. In the case that the cross-sectional shape of the light emitting element is circular, the centroid of the cross-sectional shape of the light emitting element and the centroid of the cross-sectional shape of the corresponding color conversion pattern or the light transmitting pattern are at the same position, and the diameter ratio of the cross-sectional shape of the light emitting element increases proportionally with the area.

For example, in combination with FIG. 40 and FIG. 41, in the color conversion layer 207, the light blocking region BA may be located around the light transmitting regions TA1, TA2. TA3, TA4, TA5 and TA6 in the display region.

For example, as illustrated by FIG. 37 and FIG. 38, the display panel 200 may further include a first base substrate 201. The first base substrate 201 may be made of a light transmitting material, for example, inorganic glass, organic glass, plastic substrate or other organic material substrate. The first base substrate 201 may be rigid or flexible. The first base substrate 201 may further include a buffer layer or an insulating layer to provide a substrate with better surface performance.

For example, as illustrated by FIG. 41, the light emitting element layer 202 may include a plurality of switching elements located on the first base substrate 201. In a light emitting region repeating unit, switching elements include first switching elements T1, T2 and T3. For example, the first switching element T1 may be located in the first light emitting region LA1, the second switching element T2 may be located in the second light emitting region LA2, and the third switching element T3 may be located in the third light emitting region LA3. For another example, at least one of the first switching element T1, the second switching element T2 and the third switching element T3 may be located in the non-light emitting region NLA. At least one of the first switching element T1, the second switching element T2 and the third switching element T3 may be a thin film transistor including polysilicon or a thin film transistor including an oxide semiconductor. For example, in the case that the switching element is a thin film transistor including an oxide semiconductor, it may be a thin film transistor with a top gate structure. The switching element can be connected with signal lines, and the signal lines include but not limited to a gate line, a data line and a power line.

For example, as illustrated by FIG. 41, there is an insulating layer 222 between the light emitting element layer 202 and the color conversion layer 207, and the insulating layer 222 may be located at a side of the first switching element T1, the second switching element T2 and the third switching element T3 away from the first base substrate 201. The insulating layer 222 may have a planarized surface. The insulating layer 222 is made of an organic insulating material. For example, the insulating layer 222 is made of acrylic resin, epoxy resin, imide resin or ester resin. The insulating layer 222 may have a through hole therein, which may expose electrodes of the first switching element T1, the second switching element T2 and the third switching element T3, so as to realize electrical connection.

For example, as illustrated by FIG. 41, the light emitting element layer 202 may include a plurality of light emitting elements LD located on the first base substrate 201 and connected to the switching elements. In a light emitting region repeating unit, the light emitting element LD includes a first light emitting element LD1, a second light emitting element LD2 and a third light emitting element LD3. For example, the first light emitting element LD1 may be located in the first light emitting region LA1, the second switching element T2 may be located in the second light emitting region LA2, and the third switching element T3 may be located in the third light emitting region LA3.

For example, as illustrated by FIG. 41, the first light emitting element LD1 includes a first anode AE1, the second light emitting element LD2 includes a second anode AE2, and the third light emitting element LD3 includes a third anode AE3. The first anode AE1, the second anode AE2 and the third anode AE3 may be arranged on the insulating layer 222. The first anode AE1 may be located in the first light emitting region LA1 and may be connected to the first switching element T1 through a through hole on the insulating layer 222. The second anode AE2 may be located in the second light emitting region LA2 and may be connected to the second switching element T2 through a through hole on the insulating layer 222. The third anode AE3 may be located in the third light emitting region LA3 and may be connected to the third switching element T3 through a through hole on the insulating layer 222. At least part of at least one of the first anode AE1, the second anode AE2 and the third anode AE3 may extend to the non-light emitting region NLA. The widths or areas of the first anode AE1, the second anode AE2 and the third anode AE3 may be the same or different from each other. In some embodiments, the width of the first anode AE1 may be greater than that of the second anode electrode AE2, and the width of the second anode electrode AE2 may be greater than that of the third anode electrode AE3. In other embodiments, the first anode AE1, the second anode AE2 and the third anode AE3 may be reflective electrodes. The first anode AE1, the second anode AE2 and the third anode AE3 may have a single-layer structure or a laminated structure, and may be made of metals such as Ag, Mg, Al, Pt, Pd, Au, Ni, Nd, Ir or Cr and their mixture materials, or metal oxide materials with equal conductivity such as ITO, IZO or IGZO.

For example, as illustrated by FIG. 41, the light emitting element layer 202 may include a pixel definition layer 221 located on the first anode AE1, the second anode AE2 and the third anode AE3. The pixel definition layer 221 may include openings exposing the first anode AE1, the second anode AE2 and the third anode AE3, and may define a first light emitting region LA1, a second light emitting region LA2, a third light emitting region LA3 and a non-light emitting region NLA. The material of the pixel definition layer 221 may be organic insulating materials such as at least one of acrylic resin, epoxy resin, phenolic resin, polyamide resin, polyimide resin, unsaturated polyester resin, polyphenylene resin, polyphenylene sulfide resin and benzocyclobutene (BCB).

For example, as illustrated by FIG. 41, the first light emitting element LD1, the second light emitting element LD2 and the third light emitting element LD3 further include a common light emitting layer OL. The light emitting layer OL may have the shape of a continuous film formed on the light emitting regions LA1, LA2, LA3, LA4, LA5 and LA6 and the non-light emitting region NLA. The light emitting layer OL may include a plurality of stacked layers.

Figure 42:
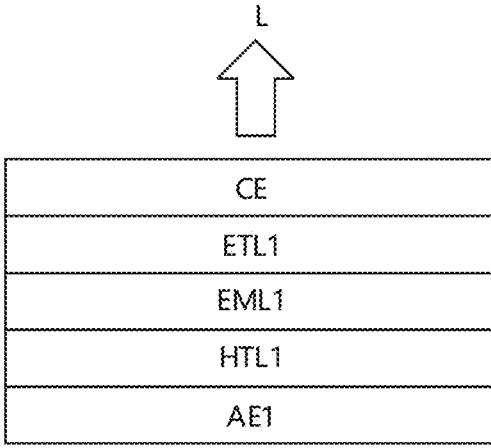
FIG. 42 is a schematic cross-sectional structure diagram of a light emitting layer provided by an embodiment of the present disclosure.

For example, FIG. 42 is a schematic cross-sectional structure diagram of a light emitting layer provided by an embodiment of the present disclosure, as illustrated by FIG. 42, the light emitting layer OL may include a first hole transport layer HTL1 located on the first anode AE1, a first light emitting material layer EML1 located on the first hole transport layer HTL1, and a first electron transport layer ETL1 located on the first light emitting material layer EML1. The first light emitting material layer EML1 may be a blue light emitting layer.

Figure 43:
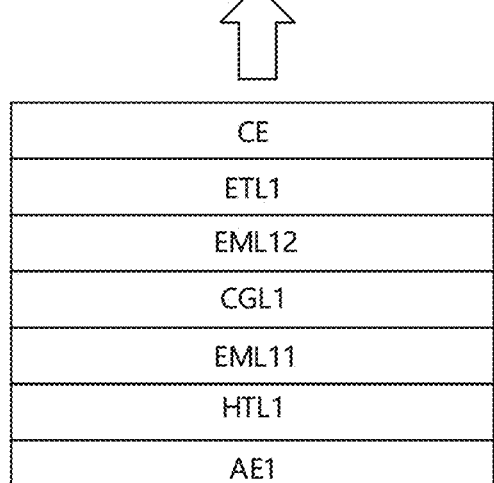
FIG. 43 is a schematic cross-sectional view of another light emitting layer provided by an embodiment of the present disclosure.

For example, FIG. 43 is a schematic cross-sectional structure diagram of another light emitting layer provided by an embodiment of the present disclosure. As illustrated by FIG. 43, in addition to the first hole transport layer HTL1, the first light emitting material layer EL11 and the first electron transport layer ETL1, the light emitting layer OL may further include a first charge generation layer CGL1 located on the first light emitting material layer EML1 and a second light emitting material layer EML12 located on the first charge generation layer CGL1. The first electron transport layer ETL1 may be located on the second light emitting material layer EML12. The second light emitting material layer EL12 may emit blue light similarly to the first light emitting material layer EML11. The second light emitting material layer EML12 may emit blue light having the same peak wavelength or a different peak wavelength as the first light emitting material layer EML11. The first light emitting material layer EML11 and the second light emitting material layer EML12 may emit light of different colors. For example, the first light emitting material layer EML11 may emit blue light and the second light emitting material layer EML12 may emit green light. The structure of two or more light emitting material layers can improve the light emitting efficiency and life of the light emitting element LD. Those skilled in the art can set the number of the light emitting material layers as needed, and the embodiments of the present disclosure are not limited thereto.

Figure 44:
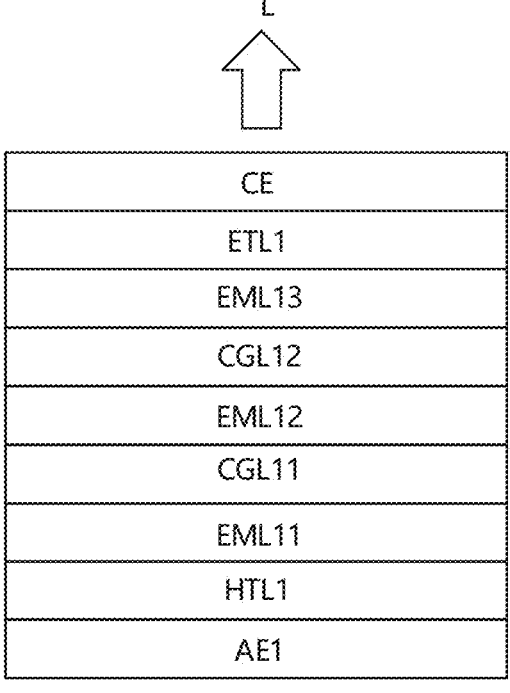
FIG. 44 is a schematic cross-sectional view of another light emitting layer provided by an embodiment of the present disclosure.

For example, FIG. 44 is a schematic cross-sectional structure diagram of another light emitting layer provided by an embodiment of the present disclosure. As illustrated by FIG. 44, in addition to the first hole transport layer HTL1, the first light emitting material layer EML11, the first electron transport layer ETL1, the first charge generation layer CGL11 and the second light emitting material layer EML12, the light emitting layer OL may further include a second charge generation layer CGL12 on the second light emitting material layer EML12 and a third light emitting material layer EML13 on the second charge generation layer CGL12. The third light emitting material layer EML13 may emit blue light similarly to the second light emitting material layer EL12 and the first light emitting material layer EML11. The third light emitting material layer EML13 may emit blue light with the same peak wavelength or different peak wavelength as the first light emitting material layer EML11 and the second light emitting material layer EML12. The first light emitting material layer EML11, the second light emitting material layer EML12 and the third light emitting material layer EML13 may emit light of different colors. For example, the first light emitting material layer EML11 may emit blue light, the second light emitting material layer EML12 may emit green light, and the third light emitting material layer EML13 may emit red light. The structure of two or more light emitting material layers can improve the light emitting efficiency and life of the light emitting element LD. Those skilled in the art can set the number of light emitting material layers as needed, and the embodiments of the present disclosure are not limited thereto. The second charge generation layer CGL12 may cooperate with the first charge generation layer CGL11 to generate more electrons.

For example, as illustrated by FIG. 41, the first light emitting element LD1, the second light emitting element LD2 and the third light emitting element LD3 may further include a common cathode CE. The cathode CE may be located on the light emitting layer OL. The cathode CE may have semi-transmissive or transmissive properties. In some embodiments, the material of the cathode CE may include Ag, Mg, Cu, Al, Pt, Pd, Au, Ni, Nd, Ir, Cr, Li, Ca, LiF/Ca, LiF/Al, Mo, Ti or a compound or mixture thereof, such as a mixture of Ag and Mg. In other embodiments, the material of the cathode CE may include transparent conductive oxide (TCO). For example, the cathode CE may include tungsten oxide (WxOx), titanium oxide (TiO₂), indium tin oxide (ITO), indium zinc oxide (IZO), zinc oxide (ZnO), indium tin zinc oxide (ITZO) or magnesium oxide (MgO), etc. In some embodiments, the light emitting element layer 202 may further include an auxiliary cathode. The auxiliary cathode is connected in parallel with the cathode layer, so that the auxiliary cathode can reduce the resistance of the cathode layer, thereby improving the problem of IR drop of the cathode and improving the display uniformity of the large-size organic light emitting diode display panel.

For example, as illustrated by FIG. 41, the light emitting element layer 202 may further include a thin film encapsulation layer TFE arranged on the cathode CE. The thin film encapsulation layer TFE may have the shape of a continuous film formed on the light emitting regions LA1, LA2, LA3, LA4, LA5 and LA6 and the non-light emitting region NLA. The thin film encapsulation layer TFE may include a first encapsulation layer ENL1, a second encapsulation layer ENL2 and a third encapsulation layer ENL3 which are stacked. For example, the first encapsulation layer ENL1 and the third encapsulation layer ENL3 are made of inorganic materials, and the inorganic materials are selected from at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON) or lithium fluoride. For another example, the second encapsulation layer ENL2 is made of an organic material, which is at least one of olefin resin, methacrylic resin, polyisoprene, vinyl resin, epoxy resin, polyurethane resin, cellulose resin or binaphthylene resin. Those skilled in the art can change the number, the material and the structure of the thin film encapsulation layer TFE as needed, and the embodiments of the present disclosure are not limited thereto.

For example, at an edge position, the first encapsulation layer ENL1 is in contact with the third encapsulation layer ENL3, and the material of the first encapsulation layer ENL1 and the material of the third encapsulation layer ENL3 are inorganic insulating materials, and the material of the second encapsulation layer ENL2 is organic insulating material.

For example, as illustrated by FIG. 41, the filling layer 220 is formed at a side of the thin film encapsulation layer TFE away from the first base substrate 201.

For example, in an example, the display panel 200 further includes a circuit unit arranged on the first base substrate 201, and the circuit unit includes a semiconductor layer, a gate insulating layer, a gate electrode, an interlayer insulating layer and a source-drain electrode layer which are stacked, and the structure of the circuit unit can refer to the conventional arrangement, which is not limited by the embodiment of the present disclosure.

For example, as illustrated by FIG. 41, the color conversion layer 207 includes a first color conversion pattern 207*a* and a second color conversion pattern 207*b*, and the display panel further includes a light transmitting pattern 207*c*, the first color conversion pattern 207*a*, the second color conversion pattern 207*b*, and the light transmitting pattern 207*c* are arranged on the same layer, and the first color conversion pattern 207*a* includes first color conversion particles 207*a*', the second color conversion pattern 207*b* includes second color conversion particles 207*b*', and the light transmitting pattern 207*c* includes scattering particles 207*c*'. The adjacent ones of the first color conversion pattern 207*a*, the second color conversion pattern 207*b*, and the light transmitting pattern 207*c* are separated by the first black matrix 206. The related features of the first color conversion pattern 207*a*, the second color conversion pattern 207*b*, the light transmitting pattern 207*c*, the first color conversion particles 207*a*', the second color conversion particles 207*b*', the scattering particles 207*c*' and the first black matrix 206 can be referred to the above-mentioned related descriptions, and the repeated portions are omitted herein.

For example, as illustrated by FIG. 41, the main function of the color film layer 210 on the color conversion layer 207 is to further filter some light of the first color that is not absorbed by the color conversion layer 207, thereby ensuring the color gamut of the display panel 200. The color film layer 210 includes a first color film pattern 210*a*, a second color film pattern 210*b* and a third color film pattern 210*c*, the first color film pattern 210*a*, the second color film pattern 210*b* and the third color film pattern 210*c* are separated by a second black matrix 209, and a second base substrate 223 is arranged at a side of the color film layer 210 away from the first base substrate 201.

For example, as illustrated by FIG. 41, a light extraction layer 208 is arranged between the layer where the first color conversion pattern 207*a*, the second color conversion pattern 207*b* and the light transmitting pattern 207*c* are located and the color film layer 210. The characteristics of the light extraction layer 208 can be referred to the relevant descriptions of the above examples, and the repeated portions are omitted herein.

For example, in an example, a thickness of the second black matrix 209 in a direction perpendicular to a main surface of the first base substrate 201 is smaller than a thickness of the first color film pattern 210*a*, a thickness of the second color film pattern 210*b* and a thickness of the third color film pattern 210*c* in a direction perpendicular to the main surface of the first base substrate 201 respectively.

For example, in an example, on a plane perpendicular to the main surface of the first base substrate 201, the shapes of the pixel of the light emitting element layer 202, the first color conversion pattern 207*a*, the second color conversion pattern 207*b* and the light transmitting pattern 207*c* are the same, and an orthographic projection of the pixel of the light emitting element layer 202 on the first base substrate 201 is within an orthographic projection of the first color conversion pattern 207*a*, the second color conversion pattern 207*b*, or the light transmitting pattern 207*c* on the first base substrate 201.

For example, in an example, the thickness of the first black matrix 206 in the direction perpendicular to the main surface of the first base substrate 201 is greater than the thickness of the second black matrix 209 in the direction perpendicular to the main surface of the first base substrate 201.

Figure 45:
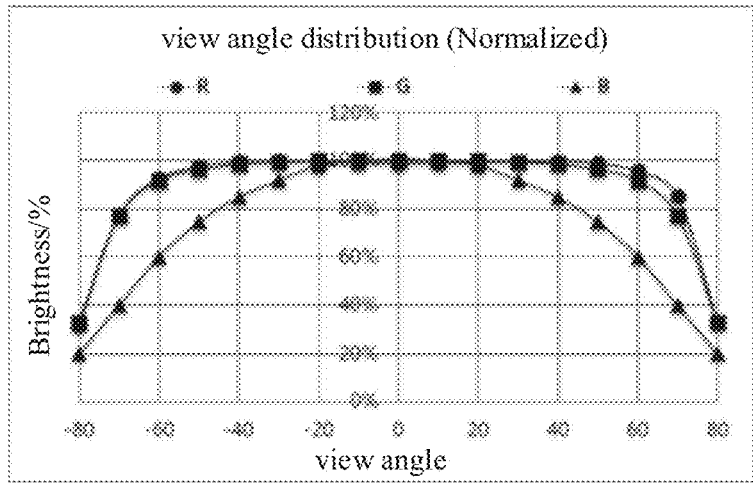
FIG. 45 is a view angle distribution diagram of a display panel with a single-layer light extraction layer provided by at least one embodiment of the present disclosure.

For example, FIG. 45 is a view angle distribution diagram of a display panel with a light extraction layer with a single-layer structure provided by at least one embodiment of the present disclosure. The light of first color is blue light, the light of second color is red light and the light of third color is green light, that is, the light emitted by the light emitting element layer 202 is blue light, the first color conversion pattern 207*a* converts blue light into red light, and the second color conversion pattern 207*b* converts blue light into green light. With reference to FIG. 2 and FIG. 45, it can be seen that, after the light extraction layer 208 is arranged between the color conversion layer 207 and the color film layer 210, the brightness of the red light can reach more than 80% in the range of −70 degrees to 75 degrees, the brightness of the green light can reach more than 78% in the range of −70 degrees to 70 degrees. In the viewing angle range of −60 degrees to 60 degrees, the brightness of blue light can reach more than 60%, which shows that the light extraction layer 208 is arranged between the color conversion layer 207 and the color film layer 210, which greatly improves the viewing angle distribution range of the red light, the green light and the blue light, that is, it can improve the front light emitting efficiency of the display device.

At least one embodiment of the present disclosure further provides a display device, the display device includes the display panels according to any one of the above embodiments, the display device may be small and medium-sized electronic devices, such as tablet computers, smart phones, head-mounted displays, car navigation units, cameras, central information displays (CID) provided in vehicles, watch-type electronic devices or other wearable devices, personal digital assistants (PDA), portable multimedia players (PMP) and game machines, and medium and large-sized electronic devices such as televisions, external billboards, monitors, household appliances including display screens, personal computers and laptop computers, and the like. The electronic device as described above may represent a simple example for applying a display device, and therefore, those skilled in the art can recognize that the display panel can also be applied to any other electronic device with a display function without departing from the spirit and scope of the present disclosure.

The display panel and the display device provided by at least one embodiment of the present disclosure have at least one of the following beneficial technical effects:

(1) In the display panel provided by at least one embodiment of the present disclosure, by arranging the light extraction layer between the color conversion layer and the color film layer, the emitting direction of light incident on the light extraction layer can be changed, the light incident to the light extraction layer can be gathered, that is, the emitting direction of light with large viewing angle can be changed, so that the light with large viewing angle can be emitted from the front side of the display device as much as possible to converge the blue light, the red light and the green light, thereby improving the light emitting efficiency of the front side of the display device.

(2) In the display panel provided by at least one embodiment of the present disclosure, adjacent first color conversion pattern and second color conversion pattern, as well as the first color conversion pattern, the second color conversion pattern and the light transmitting pattern are spaced apart by the first black matrix, and the first black matrix is in one-to-one correspondence with the first spacing region in the first direction. This arrangement can reduce the preparation difficulty of the light extraction patterns.

The following points need to be explained:

(1) The drawings of the embodiment of this disclosure only relate to the structure related to the embodiment of this disclosure, and other structures can refer to the general design.

(2) For the sake of clarity, in the drawings used to describe the embodiments of the present disclosure, the thickness of layers or regions is enlarged or reduced, that is, these drawings are not drawn to actual scale.

(3) In the case of no conflict, the embodiments of the present disclosure and the features in the embodiments can be combined with each other to obtain a new embodiment.

The above is only the specific implementation of this disclosure, but the scope of protection of this disclosure is not limited thereto, and the scope of protection of this disclosure should be subject to the scope of protection of the claims.

The invention claimed is:

1. A display panel, comprising:
a first base substrate;
a light emitting element layer, arranged on the first base substrate and configured to provide light of a first color;
a color film layer, arranged at a side of the light emitting element layer away from the first base substrate;
a color conversion layer, arranged between the light emitting element layer and the color film layer and configured to receive the light of the first color and convert at least part of the light of the first color into light of a second color; and
a light extraction layer, arranged between the color conversion layer and the color film layer and configured to converge at least one of the light of the first color and the light of the second color,
wherein the color conversion layer comprises a plurality of color conversion patterns, and the display panel further comprises a light transmitting pattern, the plurality of color conversion patterns comprise a first color conversion pattern and a second color conversion pattern, the light extraction layer comprises a substrate which is continuously arranged, the plurality of light extraction patterns are arranged at a side of the substrate away from the first base substrate, and each of the plurality of light extraction patterns comprises convex structures which are spaced apart with each other, an orthographic projection of the first color conversion pattern on the first base substrate, an orthographic projection of the second color conversion pattern on the first base substrate, and an orthographic projection of the light transmitting pattern on the first base substrate are respectively located within the orthographic projections of the convex structures corresponding to the first color conversion pattern, the second color conversion pattern and the light transmitting pattern on the first base substrate.

2. The display panel according to claim 1, wherein the first color conversion pattern comprises first color conversion particles and the second color conversion pattern comprises second color conversion particles, the light transmitting pattern comprises scattering particles, the first color conversion particles are configured to convert light of the first color into light of the second color, and the second color conversion particles are configured to convert light of the first color into light of a third color; the light transmitting pattern is configured to allow the light of the first color to pass through.

3. The display panel according to claim 2, wherein the color film layer comprises a first color film pattern, a second color film pattern and a third color film pattern, and an orthographic projection of the first color film pattern on the first base substrate and an orthographic projection of the first color conversion pattern on the first base substrate are at least partially overlapped with each other, an orthographic projection of the second color film pattern on the first base substrate and an orthographic projection of the second color conversion pattern on the first base substrate are at least partially overlapped with each other, and an orthographic projection of the third color film pattern on the first base substrate and an orthographic projection of the light transmitting pattern on the first base substrate are at least partially overlapped with each other.

4. The display panel according to claim 2, wherein the light extraction layer comprises a single-layer structure and comprises a plurality of light extraction patterns, the plurality of light extraction patterns are arranged along a first direction and each extends along a second direction, the first direction and the second direction are intersected with each other, and a direction perpendicular to a plane where the first direction and the second direction are located is a third direction, along the third direction, a size of a position of each of the plurality of light extraction patterns close to the first base substrate in the first direction is larger than a size of a position of the each of the plurality of light extraction patterns away from the first base substrate in the first direction.

5. The display panel according to claim 4,
wherein the light extraction layer further comprises a substrate which is continuously arranged, and the plurality of light extraction patterns are arranged at a side of the substrate away from the first base substrate, and each of the plurality of light extraction patterns comprises convex structures which are continuous along the first direction, the convex structures are arranged along the first direction, and each of the convex structures extends along the second direction.

6. The display panel according to claim 4,
wherein on a plane where the first direction and the third direction are located, a cross-sectional shape of the plurality of the light extraction patterns comprises at least one of sawtooth and wave.

7. The display panel according to claim 4,
wherein at least two of the convex structures are provided with a first spacing region therebetween, the convex structures are arranged along the first direction, and each of the convex structures extends along the second direction.

8. The display panel according to claim 7,
wherein in the first direction, adjacent ones of the first color conversion pattern, the second color conversion pattern and the light transmitting pattern are spaced apart by a first black matrix, and in the first direction, the first black matrix and the first spacing region are in one-to-one correspondence.

9. The display panel according to claim 8,
wherein on a plane where the first direction and the third direction are located, a cross-sectional shape of each of the light extraction patterns comprises a sawtooth, and a triangle comprised in the sawtooth is at least one of a right-angled isosceles triangle and an equilateral triangle, and in the first direction, lengths of base edges of the right-angled isosceles triangle and the equilateral triangle close to the first base substrate and a size of a corresponding one of the first color conversion pattern, the second color conversion pattern or the light transmitting pattern in a direction parallel to the base edge are equal or substantially equal.

10. The display panel according to claim 2,
wherein the light extraction layer comprises a multi-layer structure, and the light extraction layer comprises a first light extraction layer and a second light extraction layer which are stacked;
the first light extraction layer comprises a plurality of first light extraction patterns, the plurality of first light extraction patterns are arranged along a first direction and each extends along a second direction, the first direction and the second direction are intersected with each other, and a direction perpendicular to a plane where the first direction and the second direction are located is a third direction, and along the third direction, a size of a position of each of the plurality of first light extraction patterns close to the first base substrate in the first direction is larger than a size of a position of the each of the plurality of first light extraction patterns away from the first base substrate in the first direction;
the second light extraction layer comprises a plurality of second light extraction patterns, the plurality of second light extraction pattern are arranged along a fourth direction and each extends along a fifth direction, the fourth direction and the fifth direction are intersected with each other, a direction perpendicular to a plane where the fourth direction and the fifth direction are located is the third direction, and along the third direction, a size of a position of each of the plurality of second light extraction patterns close to the first base substrate in the fourth direction is larger than a size of a position of the each of the plurality of second light extraction patterns away from the first base substrate in the fourth direction.

11. The display panel according to claim 10,
wherein the first light extraction layer further comprises a first substrate which is continuously arranged, and the plurality of first light extraction patterns are arranged at a side of the first substrate away from the first base substrate, each of the plurality of first light extraction patterns comprises a plurality of first sawtooth portions which are continuous along the first direction, the plurality of first sawtooth portions are arranged along the first direction, and each of the plurality of first sawtooth portions extends along the second direction;
the second light extraction layer further comprises a second substrate which is continuously arranged, and the plurality of second light extraction patterns are arranged at a side of the second substrate away from the first base substrate, each of the plurality of second light extraction patterns comprises a plurality of second sawtooth portions which are continuous along the fourth direction, the plurality of second sawtooth portions are arranged along the fourth direction, and each of the plurality of second sawtooth portions extends along the fifth direction; an included angle between the second direction and the fifth direction ranges from 45° to 90°.

12. The display panel according to claim 10,
wherein the first light extraction layer further comprises a first substrate which is continuously arranged, and the plurality of first light extraction patterns are arranged at a side of the first substrate away from the first base substrate, each of the plurality of first light extraction patterns comprises a plurality of first sawtooth portions which are continuous along the first direction, the plurality of first sawtooth portions are arranged along the first direction, and each of the plurality of first sawtooth portions extends along the second direction;
the second light extraction layer further comprises a second substrate which is continuously arranged, and the plurality of second light extraction patterns are arranged at a side of the second substrate away from the first base substrate, each of the plurality of second light extraction patterns comprises a plurality of second sawtooth portions which are spaced apart along the fourth direction, and adjacent ones of the plurality of second sawtooth portions are provided with a second spacing region therebetween, and the plurality of second sawtooth portions are arranged along the fourth direction, and each of the plurality of second sawtooth portions extends along the fifth direction;
an included angle between the second direction and the fifth direction ranges from 45° to 90°.

13. The display panel according to claim 10,
wherein the first light extraction layer further comprises a first substrate which is continuously arranged, the plurality of first light extraction patterns are arranged at a side of the first substrate away from the first base substrate, and each of the plurality of first light extraction patterns comprises a plurality of first sawtooth portions which are spaced apart along the first direction, and adjacent ones of the plurality of first sawtooth portions are provided with a first spacing region therebetween, and the plurality of first sawtooth portions are arranged along the first direction, each of the plurality of first sawtooth portions extends along the second direction;

the second light extraction layer further comprises a second substrate which is continuously arranged, and the plurality of second light extraction patterns are arranged at a side of the second substrate away from the first base substrate, each of the plurality of second light extraction patterns comprises a plurality of second sawtooth portions which are spaced apart along the fourth direction, and adjacent ones of the plurality of second sawtooth portions are provided with a second spacing region therebetween, and the plurality of second sawtooth portions are arranged along the fourth direction, and each of the plurality of second sawtooth portions extends along the fifth direction;

an included angle between the second direction and the fifth direction ranges from 45° to 90°.

14. The display panel according to claim 13, wherein on a plane where the first direction and the third direction are located, a cross-sectional shape of each of the plurality of first sawtooth portions comprises at least one of a right-angled isosceles triangle and an equilateral triangle, and, in the first direction, lengths of base edges of the right-angled isosceles triangle and the equilateral triangle close to the first base substrate and a size of a corresponding one of the first color conversion pattern, the second color conversion pattern or the light transmitting pattern in a direction parallel to the base edge are equal or substantially equal;

on a plane where the fourth direction and the third direction are located, a cross-sectional shape of each of the plurality of second sawtooth portions comprises at least one of a right-angled isosceles triangle and an equilateral triangle, and, in the fourth direction, lengths of base edges of the right-angled isosceles triangle and the equilateral triangle close to the first base substrate and a size of a corresponding one of the first color conversion pattern, the second color conversion pattern or the light transmitting pattern in a direction parallel to the base edge are equal or substantially equal.

15. The display panel according to claim 13, wherein an orthographic projection of the first color conversion pattern on the first base substrate and an orthographic projection of the second color conversion pattern on the first base substrate are respectively located within orthographic projections of first sawtooth portions corresponding to the first color conversion pattern and the second color conversion pattern on the first base substrate;

an orthographic projection of the first color conversion pattern on the first base substrate and an orthographic projection of the second color conversion pattern on the first base substrate are respectively located within orthographic projections of the second sawtooth portions corresponding to the first color conversion pattern and the second color conversion pattern on the first base substrate.

16. The display panel according to claim 10, wherein the first light extraction layer is arranged at a side of the second light extraction layer away from the first base substrate, or the first light extraction layer is arranged at a side of the second light extraction layer close to the first base substrate.

17. The display panel according to claim 11, wherein a connection portion is arranged between the first light extraction layer and the second light extraction layer, and the connection portion fills the spacing region between the first light extraction layer and the second light extraction layer, and the first light extraction layer is arranged at a side of the second light extraction layer close to the first base substrate in the first direction, on a plane where the first direction and the third direction are located, a cross-sectional shape of the connection portion is complementary with a cross-sectional shape of the plurality of first light extraction patterns, or, the second light extraction layer is arranged at a side of the first light extraction layer close to the first base substrate, on a plane where the fourth direction and the third direction are located, the cross-sectional shape of the connection portion is complementary with the cross-sectional shape of the plurality of first light extraction patterns.

18. The display panel according to claim 1, wherein the color conversion layer comprises a flat portion, a first color conversion pattern and a second color conversion pattern, the first color conversion pattern comprises first color conversion particles, the second color conversion pattern comprises second color conversion particles, the first color conversion particles are configured to convert light of the first color into light of the second color, the second color conversion particles are configured to convert light of the first color into light of a third color, and the flat portion is configured to make that the light of the first color entering the flat portion directly transmitted by the first color.

19. The display panel according to claim 2, wherein regions corresponding to the first color conversion pattern, the second color conversion pattern and the light transmitting pattern are light transmitting regions, and regions corresponding to light emitting elements in the light emitting element layer are light emitting regions, and area of the light transmitting regions are larger than area of the light emitting regions.

* * * * *